United States Patent
Matsuzaki et al.

(10) Patent No.: US 8,878,621 B2
(45) Date of Patent: Nov. 4, 2014

(54) TEMPERATURE-COMPENSATED SEMICONDUCTOR RESISTOR DEVICE

(71) Applicant: Renesas Electronics Corporation, Kanagawa (JP)

(72) Inventors: Tomokazu Matsuzaki, Kanagawa (JP); Kazutoshi Sako, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 90 days.

(21) Appl. No.: 13/770,668

(22) Filed: Feb. 19, 2013

(65) Prior Publication Data

US 2013/0214869 A1 Aug. 22, 2013

(30) Foreign Application Priority Data

Feb. 22, 2012 (JP) .................. 2012-036409

(51) Int. Cl.
- *H03L 1/02* (2006.01)
- *H03K 3/011* (2006.01)
- *H03K 3/0231* (2006.01)
- *G05F 1/567* (2006.01)
- *H02M 3/156* (2006.01)
- *H03L 1/04* (2006.01)

(52) U.S. Cl.
CPC .............. *G05F 1/567* (2013.01); *H03K 3/011* (2013.01); *H02M 3/156* (2013.01); *H03L 1/04* (2013.01); *H03K 3/02315* (2013.01); *H03L 1/022* (2013.01)

USPC ............ 331/176; 331/111; 331/143; 327/512

(58) Field of Classification Search
CPC .......... H03L 1/022; H03L 1/02; H03K 3/011; H03K 3/02315; H03K 3/0231; G05F 1/567
USPC ............. 331/176, 111, 143, 66; 327/512, 513
See application file for complete search history.

(56) References Cited

U.S. PATENT DOCUMENTS

| 7,227,422 | B2 | 6/2007 | Yarborough, Jr. | |
| 7,936,203 | B2 * | 5/2011 | Zimlich | 327/512 |
| 8,067,992 | B2 * | 11/2011 | Chen et al. | 331/111 |
| 8,378,752 | B2 * | 2/2013 | Sako et al. | 331/17 |

* cited by examiner

*Primary Examiner* — Ryan Johnson
(74) *Attorney, Agent, or Firm* — Womble Carlyle

(57) ABSTRACT

A semiconductor device includes: a resistance R whose resistance value varies in response to a substrate temperature variation; a resistance corrector that is coupled in series with the resistance R and switches its resistance value by a preset resistance step width to suppress a resistance value variation of the resistance R; a first voltage generator for generating a first voltage that varies in response to the substrate temperature; a second voltage generator for generating second voltages Vf1 to Vfn−1 for specifying the first voltage at a point when a switching operation of the resistance value of the resistance corrector is performed; and a resistance switch unit for switching the resistance value of the resistance corrector by comparing the first voltage and the second voltages Vf1 to Vfn−1.

20 Claims, 17 Drawing Sheets

TEMPERATURE-COMPENSATED SEMICONDUCTOR RESISTOR DEVICE

CROSS-REFERENCE TO RELATED APPLICATIONS

The disclosure of Japanese Patent Application No. 2012-036409 filed on Feb. 22, 2012 including the specification, drawings and abstract is incorporated herein by reference in its entirety.

BACKGROUND

The present invention relates to a semiconductor device for suppressing a resistance value of a resistor whose resistance value varies in response to a substrate temperature.

In semiconductor devices, elements of a transistor, a resistance, a capacitor, etc. are formed over a semiconductor substrate. Then, each element has a temperature characteristic which varies depending on the substrate temperature. In addition, a circuit characteristic may vary according to the temperature characteristics of the elements. For example, in an oscillating circuit that determines an oscillating frequency of its output signal using a time constant determined by a resistance value of a resistance and a capacitance value of a capacitor, the oscillating frequency varies according to the temperature characteristic of the resistance. In the oscillating circuit like this, in order to suppress a variation of the oscillating frequency, it is necessary to perform a measure to suppress the variation of the resistance value caused by the temperature characteristic, etc.

Then, a technology of suppressing the variation of the oscillating frequency due to the temperature characteristic of the resistance is disclosed by Japanese Unexamined Patent Application Publication (Translation of PCT Application) No. 2006-510309. For a reference, FIG. 21 of Japanese Unexamined Patent Application Publication (Translation of PCT Application) No. 2006-510309 is shown in FIG. 25 and shows a block diagram of an oscillator 200. The oscillator 200 is configured so that two voltage levels used to control the oscillating frequency may be varied, which minimizes the variation of the oscillating frequency by the temperature. A first resistor R1 is used in order to suppress one of voltage levels. A second resistor R2 is used in order to suppress the other voltage level. Here, the first resistor R1 and the second resistor R2 have different temperature coefficients, respectively. Moreover, in addition, the first resistor R1 controls a current used for charging and discharging a capacitor C that generates an oscillation. In an oscillator 200, a control voltage and a current vary so that a time to charge and discharge the capacitor between control voltages may be kept almost constant to the temperature by a suitable selection of a resistance value.

More specifically, in the oscillator 200, the oscillating frequency is dependent on a difference between a first resistance value of the first resistor R1 and a second resistance value of the second resistor R2. Then, the first resistance value is larger than the second resistance value, a resistance value of the first resistor R1 exhibits a first rate of variation to the temperature, and a resistance value of the second resistor R2 exhibits a second rate of variation to the temperature. Furthermore, the second rate of variation is set up so as to be larger than the first rate of variation. By this, in the oscillator 20, a temperature variation of the first resistance value is cancelled out by a temperature variation of the second resistance value, and therefore the variation of the oscillating frequency by the temperature is decreased.

SUMMARY

A technology described in Japanese Unexamined Patent Application Publication (Translation of PCT Application) No. 2006-510309 cancels out the temperature variations of the respective resistance values by means of two resistances having different rates of variation against the temperature. However, since the resistances exhibiting different rates of temperature variation are formed of different materials, they exhibit different process variations. Therefore, if different process variations like this occur, it will be difficult to inspect which process variation of the resistance is responsible to produce an error of the resistance value or an error of the voltage value, and accordingly it will be impossible to correct the resistance value by correction means, such as trimming. That is, there is a problem that a technology described in Japanese Unexamined Patent Application Publication (Translation of PCT Application) No. 2006-510309 cannot suppress the temperature variation of the resistance value sufficiently.

According to one aspect of the present invention, a semiconductor device includes: a primary resistor whose resistance value varies in response to a variation of a substrate temperature; a resistance corrector that is coupled in series with the primary resistor and whose corrected resistance value is switched by a preset resistance step width so that a variation of the resistance value of the primary resistor in response to a variation of the substrate temperature may be suppressed; a first voltage generator for generating a first voltage that varies in response to the substrate temperature; a second voltage generator for generating a second voltage that specifies the first voltage at a point when a switching operation of the resistance value of the resistance corrector is performed; and a resistance switch unit for switching the resistance value of the resistance corrector by comparing the first voltage and the second voltage.

In the semiconductor device, a substrate temperature is detected by means of a first voltage generated by a first voltage generator, and a substrate temperature at which the resistance corrector switches the resistance value is controlled by comparing the first voltage and a second voltage. Moreover, the resistance corrector switches the corrected resistance value by a preset resistance step width so that a variation of the resistance value of the resistance value according to a variation of the substrate temperature may be suppressed. Thereby, the semiconductor device according to the aspect of the present invention can suppress a temperature variation of the resistance value of the primary resistor.

PREFERRED EMBODIMENTS

First Embodiment

Figure 1:
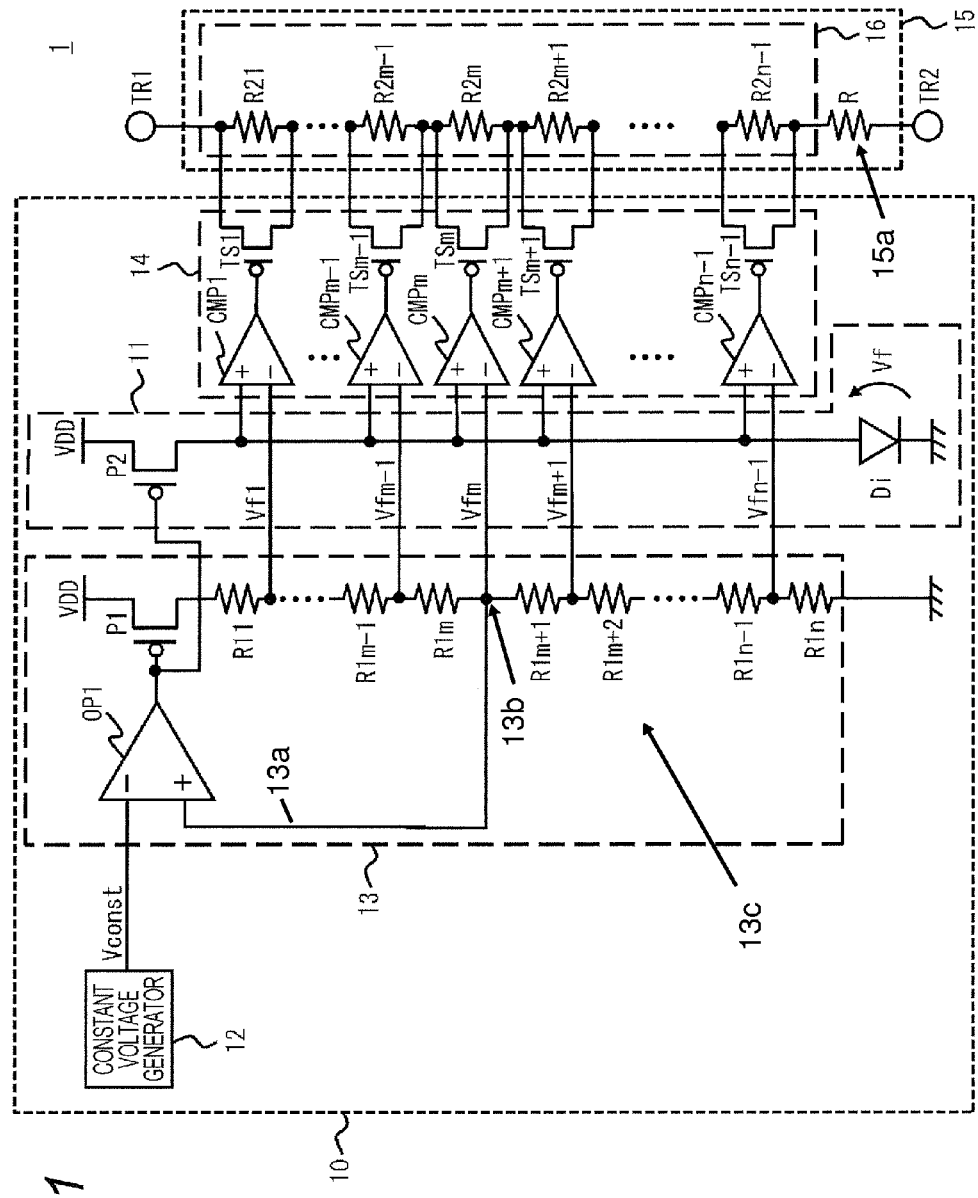
FIG. 1 is a block diagram of a semiconductor device according to a first embodiment.

Hereinafter, an embodiment of the present invention will be described with reference to drawings. FIG. 1 shows a block diagram of a semiconductor device 1 according to a first embodiment. As shown in FIG. 1, the semiconductor device 1 has a resistance value controller 10 and a temperature compensation resistor 15. The semiconductor device 1 suppresses a variation of a resistance value of the temperature compensation resistor 15 against the temperature variation by the controller 10 controlling the resistance value of the temperature compensation resistor 15 according to the temperature.

The temperature compensation resistor 15 has a primary resistor 15a with resistance R and a resistance corrector 16. The resistance R is a magnitude of the desired resistance value of the temperature compensation resistor 15. The resistance value R of the primary resistor 15a varies in response to a variation of a substrate temperature. The resistance corrector 16 is a resistor group for suppressing a temperature variation of the resistance value of the primary resistor 15a. More specifically, the resistance corrector 16 is coupled in series with the primary resistor 15a, and its corrected resistance value is switched by a preset resistance step width so that a variation of the resistance value of the resistance R according to the variation of the substrate temperature may be suppressed. In the example shown in FIG. 1, the resistance corrector 16 has a plurality of discrete, individually switchable resistances R21 to R2n–1. The corrected resistance value of the resistance corrector 16 is switched by the number of the discrete resistances that become enabled among the resistances R21 to R2n–1. Incidentally, n and m in the diagram are integers showing a number of the constituents.

Moreover, a terminal TR1 is provided at one end of the temperature compensation resistor 15; a terminal TR2 is provided at the other end thereof. The terminals TR1, TR2 are terminals for coupling with other circuits that are not illustrated. A temperature-compensated resistance is provided between the terminals TR1, TR2.

A resistance value controller 10 has a first voltage generator (e.g., a temperature variation voltage generator 11), a constant voltage generator 12, a second voltage generator (e.g., a switch voltage generating circuit 13), and a resistance switch unit 14.

A temperature variation voltage generating circuit 11 generates a first voltage that varies according to the substrate temperature. The temperature variation voltage generating circuit 11 has a diode Di and a PMOS transistor P2. The PMOS transistor P2 is an element functioning as a current source. In the PMOS transistor P2, its source is coupled to a first power supply terminal (e.g., a power supply terminal VDD) and its gate is commonly coupled with the PMOS transistor P1 of the switch voltage generating circuit 13 that will be described later. Moreover, a drain of the PMOS transistor P2 is coupled to an anode of the diode Di. A cathode of the diode Di is coupled to a second power supply terminal (e.g., a ground terminal GND). The diode generates a forward voltage Vf by using a current supplied from the PMOS transistor P2 as an operating current. This forward voltage Vf varies linearly with a negative gradient in response to a temperature variation of the semiconductor substrate. The forward voltage Vf corresponds to the first voltage and in the discussion below it is called a temperature-dependent voltage Vf.

The constant voltage generator 12 generates a constant voltage Vconst. This constant voltage generator 12 is comprised of, for example, a band gap voltage source circuit etc. That is, the constant voltage Vconst that the constant voltage generator 12 generates has an almost fixed voltage value to the substrate temperature.

The switch voltage generating circuit 13 generates a second voltage (e.g., a switch voltage) that specifies the first voltage (e.g., the temperature-dependent voltage Vf) at the time of performing a switching operation of the corrected resistance value of the resistance corrector. In the semiconductor device 1 according to the first embodiment, the switch voltage generating circuit 13 generates multiple switch voltages Vf1 to Vfn−1.

The switch voltage generating circuit 13 has a differential amplifier OP1, a PMOS transistor P1, and resistances R11 to R1n. In the PMOS transistor P1, its source is coupled to the power supply terminal VDD and its gate is coupled to an output terminal of the differential amplifier OP1. The resistances R11 to R1n are coupled in series between a drain of the PMOS transistor P1 and the ground terminal GND. Then, the resistances R11 to R1n generate a feedback signal 13a at a coupling point 13b of the resistance R1m and the resistance R1m+1. Here, in the semiconductor device 1 according to the first embodiment, the first resistance is comprised of the resistances R11 to R1m, and the second resistance is comprised of the resistance R1m+1 to R1n. In the differential amplifier OP1, the constant voltage Vconst is inputted into its inverting input terminal, and a feedback signal is inputted into its noninverting input terminal. That is, in the switch voltage generating circuit 13, a negative feedback amplifier is comprised of the differential amplifier OP1, the PMOS transistor P1, and the resistances R1 to R1n, and a voltage obtained by amplifying the constant voltage Vconst according to a ratio of the resistance values of the first resistance and the second resistance. Moreover, the switch voltage generating circuit 13 outputs a total of n−1 switch voltages, Vf1 to Vf1n−1, generated at multiple nodes that couple respective resistances R11 to R1n as multiple second voltages (e.g., temperature step setting resistances).

The resistance switch unit 14 compares the temperature variation voltage and the switch voltage, and switches the corrected resistance value of the resistance corrector 16. More specifically, the resistance switch unit 14 has comparators CMP1 to CMPn−1 and switch transistors TS1 to TSn−1. When there are the multiple switch voltages, the comparators CMP1 to CMPn−1 are provided corresponding to the respective switch voltages. In each of the comparators CMP1 to CMPn−1, the temperature-dependent voltage Vf is inputted into its noninverting input terminal, and a corresponding voltage among the switch voltages Vf1 to Vfn−1 is inputted into its inverting input terminal.

In the semiconductor device 1 according to the first embodiment, each of the switch transistors TS1 to TSn−1 is comprised of a PMOS transistor. In each of the switch transistors TS1 to TSn−1, an output of a corresponding comparator among the comparators CMP1 to CMPn−1 is inputted into its gate. That is, the switch transistors TS1 to TSn−1 are switched between a conduction state and a cut-off state by the respective comparators CMP1 to CMPn−1. Moreover, in each of the switch transistors TS1 to TSn−1, its source is coupled to one end of one corresponding resistance among the resistances R21 to R2n−1 of the resistance corrector 16 and its drain is coupled to the other end of the corresponding resistance. Thus, each switch transistor TS1 to TSn−1 is configured to selectively bypass or connect corresponding resistance R21 to R2n−1.

Figure 2:
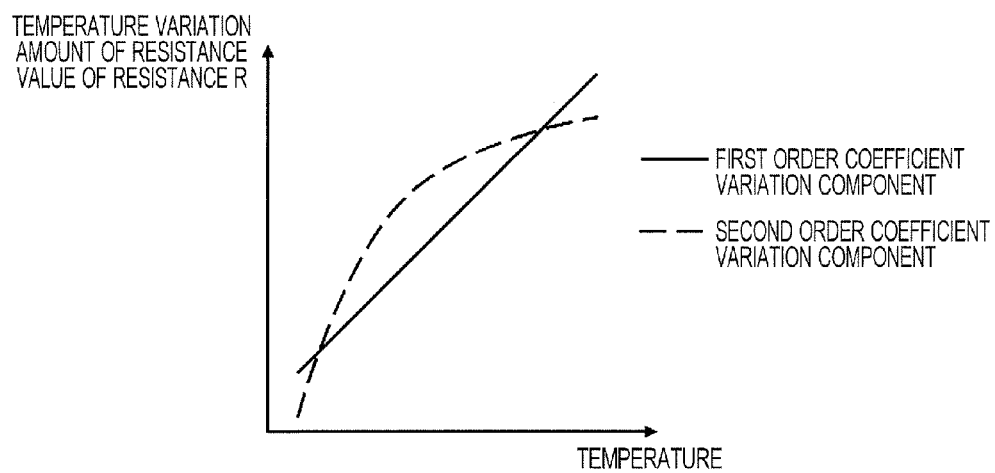
FIG. 2 is a diagram for explaining a temperature variation of a resistance value of a resistor.

Next, a temperature characteristic of the resistance R will be explained. FIG. 2 shows a graph showing the temperature characteristic of the resistance value of the resistance R. As shown in FIG. 2, the resistance value of the resistance R becomes higher as the substrate temperature increases. Moreover, in the example shown in FIG. 2, the temperature variation component of the resistance R has a first-order coefficient variation component such that the resistance value varies with a first-order coefficient and a second-order coefficient variation component such that the resistance value varies with a second-order coefficient. The semiconductor device 1 according to the first embodiment suppresses this temperature variation of the resistance value even when the resistance R has a temperature characteristic containing variation components of coefficients of different orders. In the semiconductor device 1 according to the first embodiment, preset values of variation step setting resistances R21 to R2n and preset values of the switch voltages Vf1 to Vf1n−1 are set according to a gradient of the temperature variation of the resistance R, and thereby the temperature variation of the resistance value of the resistance R is suppressed. Then, a setting method of the resistance values of the variation step setting resistances R21 to R2n and a setting method of the voltage values of the switch voltages Vf1 to Vf1n−1 will be explained below. Incidentally, below, an example in which the number of resistances R21 to R2n−1 is assumed to be seven (namely, n=8) will be explained.

Figure 3:
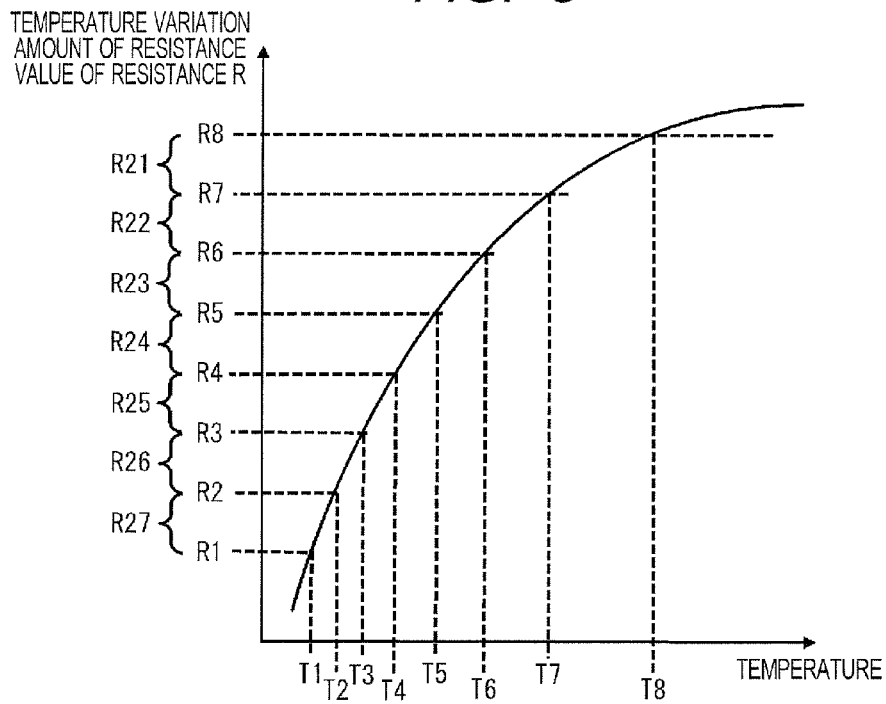
FIG. 3 is a graph for explaining a setting of the resistance value of a resistance corrector of the semiconductor device according to the first embodiment.

FIG. 3 shows a graph for explaining the setting of the resistance values of the variation step setting resistances R21 to R27 that form the resistance corrector 16. The graph of the temperature variation of the resistance value of the resistance R shown in FIG. 3 contains the first-order coefficient variation component and the second-order coefficient variation component. Moreover, in the example shown in FIG. 3, a lower limit of the temperature variation range permitted in the semiconductor substrate is represented by a temperature T1, and an upper limit of the temperature variation range is represented by a temperature T8. Then, in the example shown in FIG. 3, the resistance value of the resistance R corresponding to the temperature T1 is represented by R1, and the resistance value of the resistance R corresponding to the temperature T8 is represented by R8. In the semiconductor device 1 according to the first embodiment, a resistance variation range shown by the resistance value R1 to the resistance value R8 is equally divided up into seven equal steps. In FIG. 3, symbols of R2 to R7 are assigned to respective resistance values between R1 and R8, in equal steps. Then, in the semiconductor device 1 according to the first embodiment, a resistance value equivalent to a resistance value difference between the resistance values R1 to R8 having been divided up equally is designated as a single resistance value of the variation step setting resistances R21 to R27. Moreover, the temperatures T1 to T8 corresponding to the respective resistance values R1 to R8 are computed using the graph shown in FIG. 3, after the values R1 to R8 are assigned.

Figure 4:
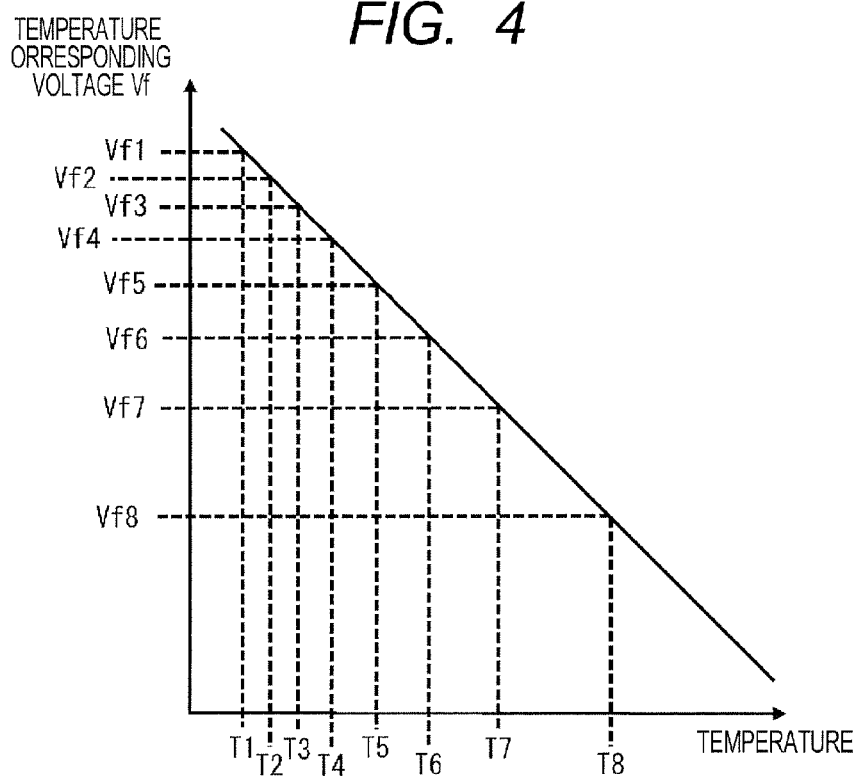
FIG. 4 is a graph for explaining a setting of a second voltage generated in a second voltage generator of the semiconductor device according to the first embodiment.

Next, FIG. 4 shows a graph for explaining the setting of the switch voltages Vf1 to Vf7 generated in the switch voltage generating circuit 13 of the semiconductor device 1. The graph shown in FIG. 4 shows a temperature characteristic of the temperature-dependent voltage Vf that the diode Di generates. As shown in FIG. 4, the temperature-dependent voltage Vf varies linearly with a negative gradient to the temperature, i.e., the temperature-dependent voltage Vf varies inversely with temperature. Then, the semiconductor device 1 according to the first embodiment sets the voltages Vf corresponding to the temperatures T1 to T8 computed in the graph shown in FIG. 3 as the switch voltages Vf1 to Vf8, respectively. As shown in FIG. 4, since respective temperature differences of the temperatures T1 to T8 vary with the second-order coefficient, the switch voltages Vf1 to Vf8 also vary with variation widths expressed by the second-order coefficient.

These switch voltages Vf1 to Vf8 are generated at the coupling nodes that couple to respective temperature step setting resistances R11 to R18 of voltage divider 13c. That is, as the temperature step setting resistance is provided closer to the ground terminal GND, the resistance value is set larger, and a difference between resistance values are set so as to be equal to the variation width expressed by the second-order coefficient. In other words, the n=8 temperature step setting resistances R11 to R18 collectively form a voltage divider 13c having n−1=7 internal nodes, each internal node being at one of the switch voltages Vf1 to Vf7 determined from FIG. 4. And since the switch voltages Vf1 to Vf7 are unequally spaced in this first embodiment (see FIG. 4), the voltage divider 13c in this first embodiment can have unequal temperature step setting resistances R11 to R17.

Figure 5:
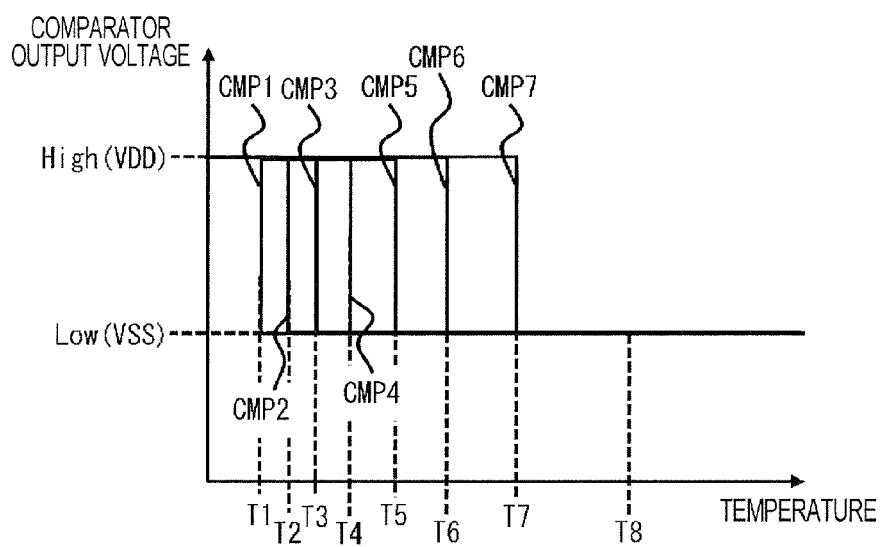
FIG. 5 is a graph for explaining an operation of a comparator of the semiconductor device according to the first embodiment.

Next, an operation of the semiconductor device 1 according to the first embodiment based on the variation step setting resistances R21 to R27 and the temperature step setting voltages Vf1 to Vf7 all of which have preset values having been set in FIG. 3 and FIG. 4 will be explained. FIG. 5 shows a graph showing an operation of a comparator of the semiconductor device 1 based on these preset values.

As shown in FIG. 5, in the semiconductor device 1 according to the first embodiment, each comparator CMP1 to CMPn−1 outputs either a high voltage (VDD) or a low voltage (GND). As the substrate temperature rises higher, an output voltage of the comparator corresponding to the temperature step setting voltage having a higher voltage value switches from the high level (e.g., a supply voltage VDD) to the low level (e.g., the ground voltage GND). More specifically, when the substrate temperature reaches the temperature T1, the temperature-dependent voltage Vf becomes smaller than the temperature step setting voltage Vf1, and the output voltage of the comparator CMP1 switches from the high level to the low level. Moreover, when the substrate temperature reaches the temperature T2, the temperature-dependent voltage Vf becomes smaller than the temperature step setting voltage Vf2, and the output voltage of the comparator CMP2 switches from the high level to the low level.

When a comparator's output is at the low level, the corresponding switch transistor is in the conduction state and causes the associated variation step setting resistance to be disabled (i.e., "short-circuited" or "bypassed"). On the other hand, when a comparator's output is at the high level, the corresponding switch transistor is in the cut-off state and causes the associated variation step setting resistance to be enabled (i.e., "applied"). Thus, the number of comparators CMP1 to CMPn−1 having their output voltages at the high level determines the number of switch transistors TS1 to TSn−1 that are in the cut-off state, and therefor the number of variation step setting resistances enabled. As shown in FIG. 5, in the semiconductor device 1 according to the first embodiment, the higher the substrate temperature rises, the higher the number of the comparators CMP1 to CMPn−1 whose output levels are at the low level. Thus, the higher the substrate temperature rises, the higher the number of the variation step setting resistances that become disabled (i.e., bypassed).

When the substrate temperature is very high, the temperature-dependent voltage Vf of the diode D1 is very low. Since the very low diode voltage Vf is input to the high input of the comparators, all of the comparator outputs are at the low level, thereby causing all the switch transistors to conduct and their associated variation step setting resistances to be bypassed. Thus, when the substrate temperature is very high, the resistance corrector 16 does not contribute any resistance to the temperature compensation resistor 15. On the other hand, when the substrate temperature is very low, the opposite happens. The temperature-dependent voltage Vf of the diode D1 is very high; all of the comparator outputs are at the high level, thereby causing all the switch transistors to be in cut-off and their associated variation step setting resistances to be enabled. Thus, when the substrate temperature is very low, the resistance corrector 16 contributes maximum resistance to the temperature compensation resistor 15. At substrate temperatures between these extremes, varying numbers of the associated variation step setting resistances are enabled, depending on the value of the temperature-dependent voltage Vf of the diode D1. And since the switch voltages Vf1 to Vf7 are unequally spaced, as seen further below, there is a non-linear relationship between the temperature-dependent voltage Vf and the corrected resistance value of the resistance corrector 16.

Figure 6:
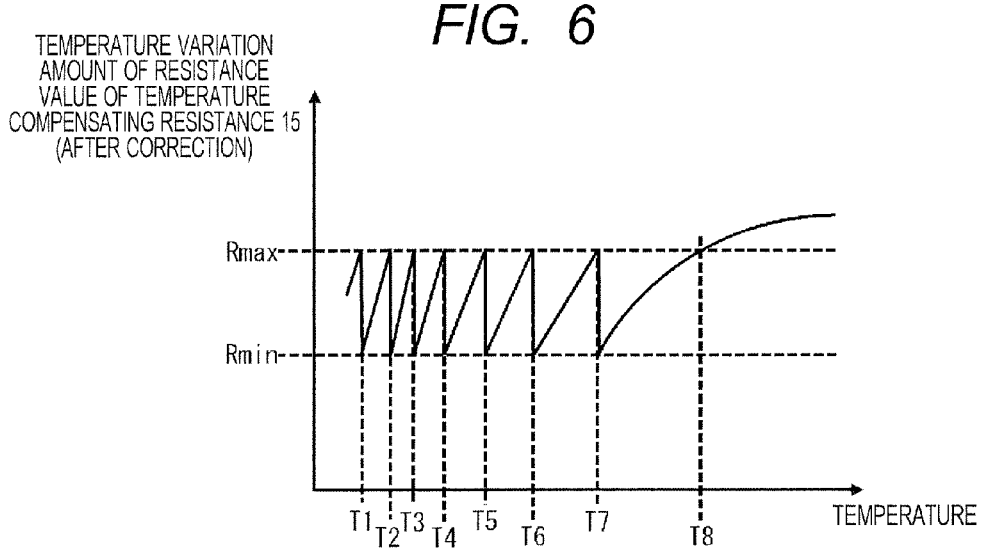
FIG. 6 is a graph for explaining the temperature variation of the resistance value in the semiconductor device according to the first embodiment.

FIG. 6 shows a graph showing a variation of the resistance value of the temperature compensation resistor 15 against the substrate temperature. As shown in FIG. 6, in the semiconductor device 1, the resistance value is switched so that the resistance value decreases each time the substrate temperature reaches a next higher one of the temperatures T1 to T8 obtained in FIG. 3. Thereby, in the semiconductor device 1, even when the substrate temperature rises, the resistance value of the temperature compensation resistor 15 is controlled so as to fall within a range between the maximum resistance value Rmax and the minimum resistance value Rmin. Here, a variation width of the resistance value of the temperature compensation resistor 15 accompanying the switching thereof shown in FIG. 6 is a magnitude corresponding to the magnitude of the resistance value of the variation step setting resistance. In the example shown in FIG. 6, the variation width of the resistance value of the temperature compensation resistor 15 is suppressed to $\frac{1}{7}$ times that of the case where the control of the resistance value of the temperature compensation resistor 15 by the resistance value controller 10 is not performed.

From the above-mentioned explanation, the semiconductor device 1 according to the first embodiment has: the temperature variation voltage generating circuit 11 for generating the voltage Vf that varies in response to the substrate temperature; the switch voltage generating circuit 13 for generating the temperature step setting voltages Vf1 to Vfn−1 each of which specifies the temperature-dependent voltage Vf at a point when a switching operation of the corrected resistance value of the resistance corrector 16 is performed; and a resistance switch unit that compares the temperature-dependent voltage Vf and the temperature step setting voltages Vf1 to Vfn−1 and switches the corrected resistance value of the resistance corrector 16. Moreover, in the resistance corrector 16, the corrected resistance value is switched by the preset resistance step width so that a variation of the resistance value of the resistance R according to a variation of the substrate temperature may be suppressed. Thereby, the semiconductor device 1 according to the first embodiment can suppress the amount of temperature variation of the resistance value of the resistance R by switching the corrected resistance value of the resistance corrector 16, and can suppress the amount of variation of the resistance value of the temperature compensation resistor 15 within a fixed range. It is also possible to suppress the variation width of the resistance value of the temperature compensation resistor 15 to, for example, about ±1% by suppressing the temperature variation of the resistance value in this way.

Moreover, in the semiconductor device 1 according to the first embodiment, voltage differences between the temperature step setting voltages are set unequally (in the switch voltage generating circuit 13) by the voltage divider 13c. Thereby, in the semiconductor device 1 according to the first embodiment, the substrate temperature at which the resistance value of the temperature compensation resistor 15 is switched can be set unequally according to a direction of variation of the resistance value. Then, the semiconductor device 1 according to the first embodiment can suppress the temperature variation width of the resistance value of the resistance R within a prescribed range, even in the case where the temperature variation of the resistance value of the resistance R contains a variation component of the second-order coefficient.

Second Embodiment

In a second embodiment, a setting method of the variation step setting resistances R21 to R2n−1 in the case where the resistance R has only a variation component of the first-order coefficient and a setting method of the temperature step setting voltage Vf1 to Vfn−1 will be described. Incidentally, below, an example where the number of the resistances R21 to R2n−1 is determined to be seven (namely, n=8) will be explained.

Figure 7:
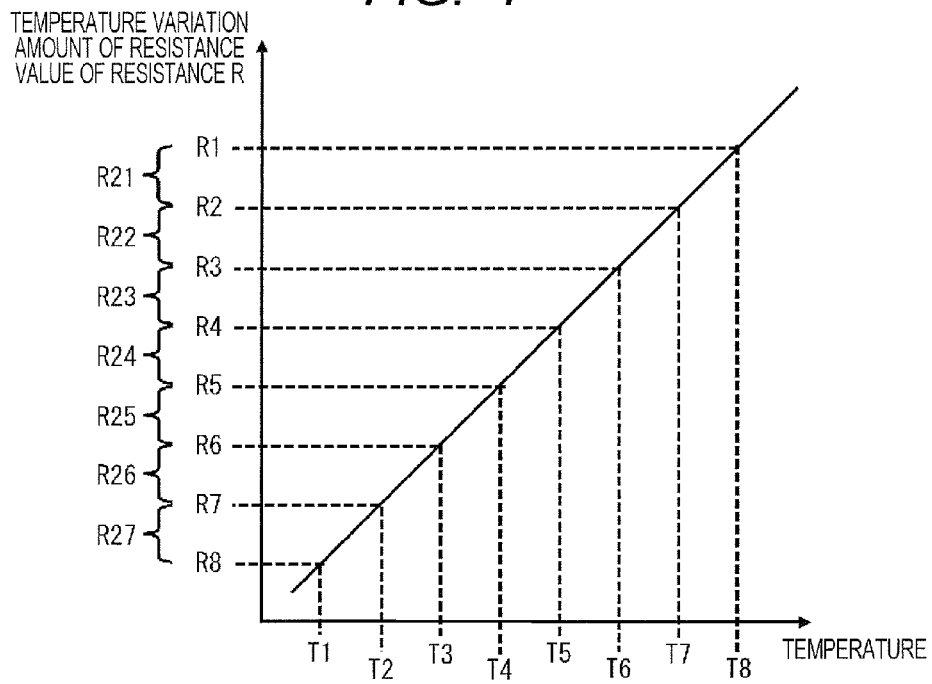
FIG. 7 is a graph for explaining a setting according to a second embodiment.

FIG. 7 shows a graph for explaining a setting of the corrected resistance value of the resistance corrector of the variation step setting resistances R21 to R27 that form the resistance corrector 16. The graph of the temperature variation of the resistance value of the resistance R shown in FIG. 7 includes only the first-order coefficient variation component. Moreover, in the example shown in FIG. 7, the lower limit of the temperature variation range permitted for the semiconductor substrate is represented by the temperature T1, and the upper limit of the temperature variation range is represented by the temperature T8. Then, in the example shown in FIG. 7, the resistance value of the resistance R corresponding to the temperature T1 is represented by R1, and the resistance value of the resistance R corresponding to the temperature T8 is represented by R8. In the semiconductor device 1 according to the second embodiment, the resistance variation range shown with the resistance value R1 to the resistance value R8 is divided up equally into seven equal steps. In FIG. 7, symbols R2 to R7 are assigned to the respective resistance values between R1 and R8, in equal steps. Then, in the semiconductor device 1 according to the second embodiment, a resistance value equivalent to the resistance value difference between the resistance values R1 to R8 having been divided up equally is designated as the single resistance value of the variation step setting resistances R21 to R27. Moreover, the temperatures T1 to T8 corresponding to respective resistances R1 to R8 are computed using the graph shown in FIG. 7, after the values R1 to R8 are determined.

Figure 8:
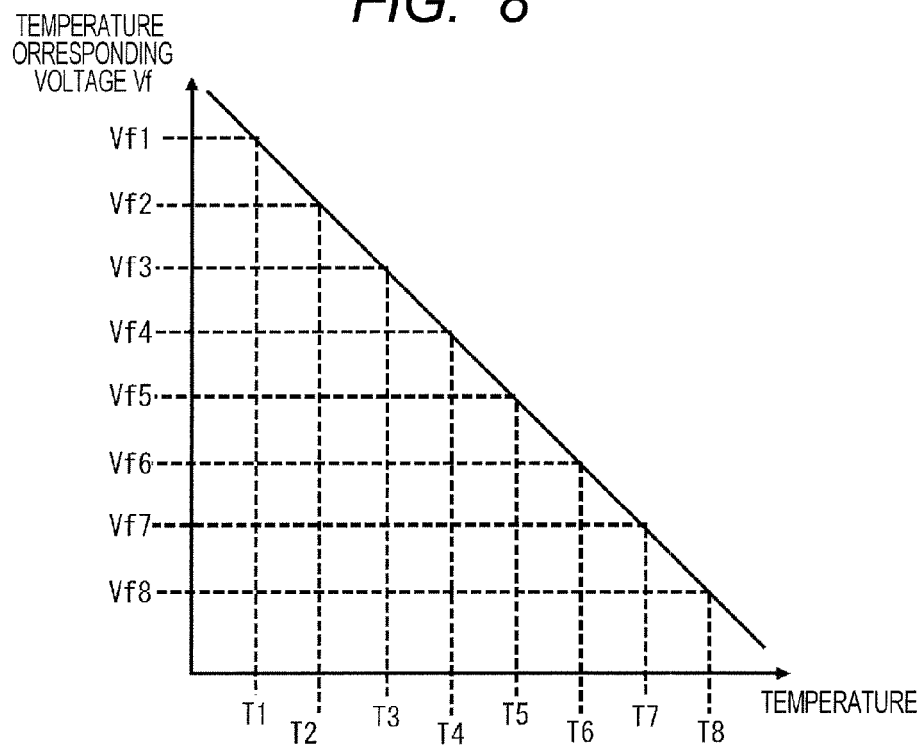
FIG. 8 is a graph for explaining a setting of the voltage of the second voltage generated in the second voltage generator of the semiconductor device according to the second embodiment.

Next, FIG. 8 shows a graph for explaining a setting of the switch voltages Vf1 to Vf7 generated in the switch voltage generating circuit 13 of the semiconductor device 1. The graph shown in FIG. 8 shows the temperature characteristic of the temperature-dependent voltage Vf that the diode Di generates. As shown in FIG. 8, the temperature-dependent voltage Vf varies linearly with a negative gradient to the temperature. Then, in the semiconductor device 1 according to the second embodiment, the temperature-dependent voltages Vf corresponding to the temperatures T1 to T8 computed by the graph shown in FIG. 8 are set as the switch voltages Vf1 to Vf8, respectively. As shown in FIG. 8, since each temperature difference between the temperatures T1 to T8 varies with the first-order coefficient, the voltage values of the switch voltages Vf1 to Vf8 vary with the variation width expressed by a first-order coefficient.

These switch voltages Vf1 to Vf8 are generated at coupling nodes that couple the respective temperature step setting resistances R11 to R18. And since the switch voltages Vf1 to Vf7 are equally spaced in this second embodiment (see FIG. 8), the voltage divider 13c in this second embodiment can have equal temperature step setting resistances R11 to R17.

That is, in the second embodiment, the temperature step setting resistances R11 to R17 are set to the same resistance value.

Figure 9:
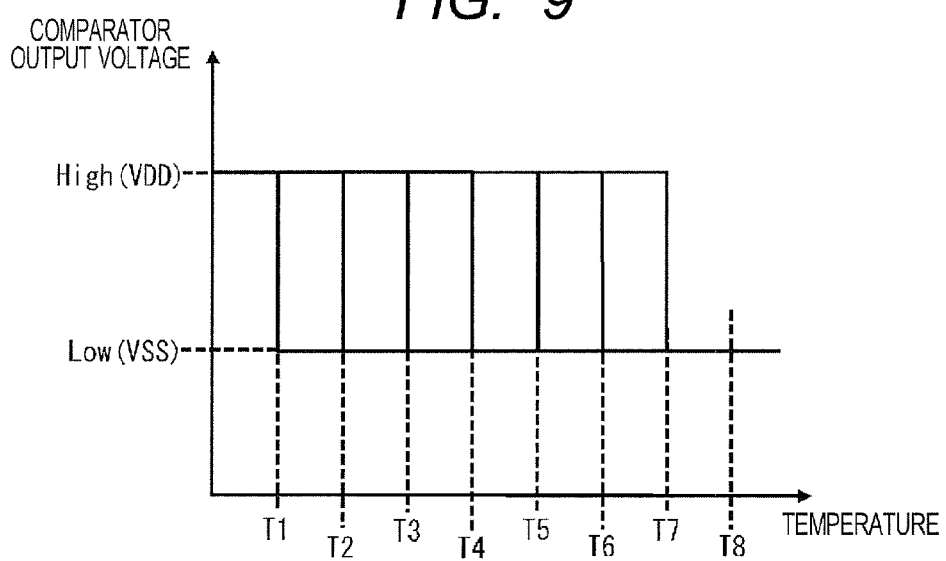
FIG. 9 is a graph for explaining an operation of a comparator of the semiconductor device according to the second embodiment.

Next, an operation of the semiconductor device 1 according to the second embodiment based on the variation step setting resistances R21 to R27 and the temperature step setting voltages Vf1 to Vf7 all of which have preset values having been set in FIG. 7 and FIG. 8 will be explained. FIG. 9 shows a graph showing an operation of the comparator of the semiconductor device 1 based on these preset values.

As shown in FIG. 9, in the semiconductor device 1 according to the second embodiment, as the substrate temperature rises higher, the output voltage of the comparator corresponding to the temperature step setting voltage having a high voltage value switches from the high level (e.g., the supply voltage VDD) to the low level (e.g., the ground voltage GND). More specifically, when the substrate temperature reaches the temperature T1, the temperature-dependent voltage Vf becomes smaller than the temperature step setting voltage Vf1, and the output voltage of the comparator CMP1 switches from the high level to the low level. Moreover, when the substrate temperature reaches the temperature T2, the temperature-dependent voltage Vf becomes smaller than the temperature step setting voltage Vf2, and the output voltage of the comparator CMP2 switches from the high level to the low level.

As explained with reference to the first embodiment, the number of the switch transistors TS1 to TSn−1 that are in the cut-off state is controlled according to the number of the comparators CMP1 to CMPn−1 whose output voltage is in the high level. Also, the variation step setting resistance to which the switch transistor in the cut-off state is coupled is enabled; and the variation step setting resistance to which the switch transistor in the conduction state is coupled is disabled. As shown in FIG. 9, in the semiconductor device 1 according to the second embodiment, the higher the substrate temperature rises, the higher the number of the comparators CMP1 to CMPn−1 whose output levels become the low level, thus placing the corresponding switch transistors in the conduction state and bypassing the corresponding variation step setting resistances. That is, in the semiconductor device 1 according to the second embodiment, the higher the substrate temperature rises, the more the number of the variation step setting resistances that become disabled increases.

Figure 10:
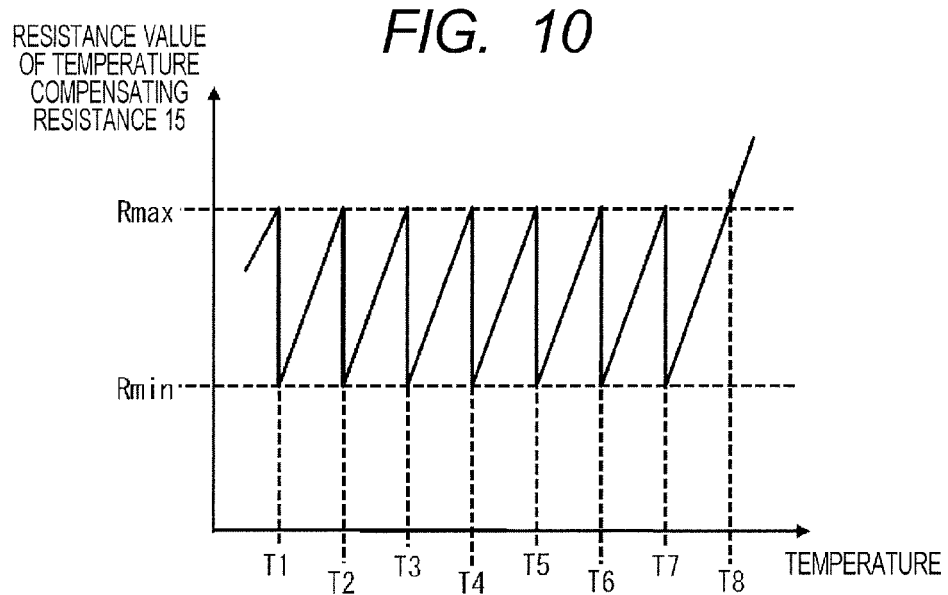
FIG. 10 is a graph for explaining the temperature variation of the resistance value in the semiconductor device according to the second embodiment.

Hence, a graph showing the variation of the resistance value of the temperature compensation resistor 15 against the substrate temperature is shown in FIG. 10. As shown in FIG. 10, in the semiconductor device 1, the resistance value is switched so that the resistance value may be decreased each time the substrate temperature reaches a next higher one of the temperatures T1 to T8 obtained in FIG. 7. Thereby, even when the substrate temperature rises, in the semiconductor device 1, the resistance value of the temperature compensation resistor 15 is controlled so as to fall within a range between a maximum resistance value Rmax and a minimum resistance value Rmin. In the example shown in FIG. 10, the variation width of the resistance value of the temperature compensation resistor 15 is suppressed to $\frac{1}{7}$ times that of the case where the control of the resistance value of the temperature compensation resistor 15 by the resistance value controller 10 is not performed.

From the above-mentioned explanation, the voltage differences between the temperature step setting voltages in the semiconductor device 1 are equally set in the second embodiment. Thereby, the semiconductor device 1 according to the second embodiment can suppress the temperature variation of the resistance value of the resistance R that has only the first-order coefficient variation component. Thus, the semiconductor device 1 according to the present invention can support temperature variations of the resistance values of various resistances R by setting the preset value of the temperature step setting voltage appropriately according to the gradient of the temperature variation of the resistance value of the resistance R. Incidentally, it is also possible to correct against the temperature variation of the resistance value of the resistance R by setting the resistance values of the variation step setting resistances of the temperature compensation resistor 15 to unequally spaced values, in addition to the temperature step setting voltage.

Third Embodiment

Figure 11:
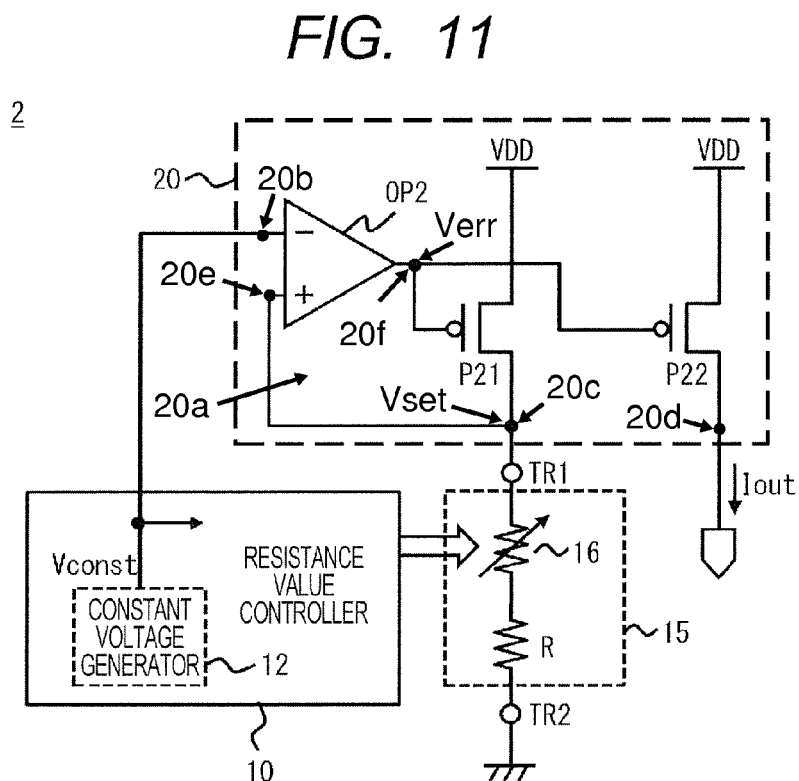
FIG. 11 is a block diagram of a constant current source circuit using the semiconductor device according to the first embodiment.

In the third embodiment, a constant current source circuit 2 using the semiconductor device 1 according to the first embodiment will be described. FIG. 11 shows a block diagram of the constant current source circuit 2 according to the third embodiment. As shown in FIG. 11, the constant current source circuit 2 has the semiconductor device 1 (this is shown in FIG. 11 as being divided into the resistance value controller 10 and the temperature compensation resistor 15) according to the first embodiment and a current generating circuit 20. Incidentally, in FIG. 11, a description of the resistance value controller 10 other than the temperature variation voltage generating circuit 11 is omitted. Moreover, in FIG. 11, the resistance corrector 16 is shown by a symbol of a variable resistance.

The current generating circuit 20 has an error amplifier OP2 and PMOS transistors P21, P22. The error amplifier OP2 and the first PMOS transistors P21 together form a buffer circuit 20a, described below. The current generating circuit 20 also has an input node 20b, a first output node 20c at a first terminal of the first PMOS transistors P21 and a second output node 20d at a first terminal of the second PMOS transistor P22. The error amplifier OP2 has a first input 20b (which for this discussion is the same as the current generating circuit's input node 20b), a second input 20e and an output 20f. Then, the current generating circuit 20 generates an output current Iout at the second output node 20d, based on the constant voltage Vconst and the temperature-compensated resistance of the temperature compensation resistor 15.

In the PMOS transistor P21, its source is coupled to the power supply terminal to which the supply voltage VDD is supplied and its drain is coupled to the ground terminal through the temperature compensation resistor 15. At its output 20f, the error amplifier OP2 gives an error voltage Verr to a gate of the PMOS transistor P21 based on a voltage difference between the constant voltage Vconst and the current setting voltage Vset generated at a node between the PMOS transistor P21 and the temperature compensation resistor 15. Then, the PMOS transistor P21 outputs a current to the temperature compensation resistor 15 based on the error voltage Verr so that the voltage generated across the both ends of the temperature compensation resistor 15 may become the constant voltage Vconst. Here, in the current generating circuit 20, the current setting voltage Vset generated at a node between the drain of the PMOS transistor P21 and the temperature compensation resistor 15 becomes the same voltage value as the constant voltage Vconst by virtual short circuit of the error amplifier OP2. In this sense, the error amplifier OP2 and the PMOS transistor P21 together function as a buffer circuit 20a of the current generating circuit 20 by allowing the input voltage Vconst to appear at the first output node 20c of current generating circuit 20, thereby "buffering" the voltage Vconst. As seen in FIG. 11, the current setting voltage Vset from the first PMOS transistor P21 is fed back to the second input 20e of the error amplifier OP2. The PMOS transistor P22 and the PMOS transistor P21 are current-mirror coupled. Moreover, the PMOS transistor P22 outputs a current proportional to a current that the PMOS transistor P21 sends to the temperature compensation resistor 15 as the output current Iout. A ratio of a current flowing in the PMOS transistor P21 and a current flowing in the PMOS transistor P22 is determined by a transistor size ratio of the two transistors. For example, if the transistor size ratio is 1:1, the current flowing in the PMOS transistor P21 and the current flowing in the PMOS transistor P22 will be the same; if the transistor size ratio is 1:2, the current flowing in the PMOS transistor P22 will be two times as large as the current flowing in the PMOS transistor P21. Incidentally, the transistor size ratio is determined by a ratio of gate widths of the PMOS transistors P21, P22 provided that their gate lengths are equal. Moreover, in the case where PNP transistors are used instead of the PMOS transistors P21, P22, a transistor size is determined by an area ratio of emitters of the PNP transistors.

Here, as was explained in the first and the second embodiments, the temperature compensation resistor 15 is controlled so that the variation range of the resistance value may fall within a fixed range against the temperature variation. Because of such a setting, a variation width of the output current Iout of the constant current source circuit 2 according to the third embodiment that accompanies the variation of the substrate temperature is suppressed by the variation width of the resistance value of the temperature compensation resistor 15. Then, FIG. 12 shows a graph showing a temperature characteristic of an output current of the constant current source circuit 2 according to the third embodiment.

Figure 12:
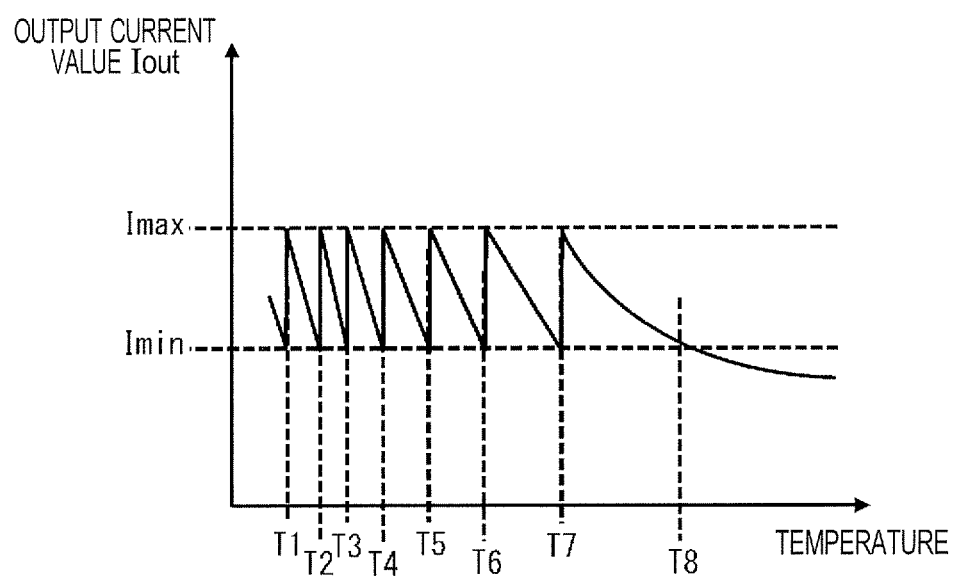
FIG. 12 is a graph for explaining a temperature variation of an output current of the constant current source circuit shown in FIG. 11.

In the constant current source circuit 2, the resistance value of the temperature compensation resistor 15 is switched so as to become small each time the substrate temperature reaches another one of the temperatures T1 to T8, Therefore, as shown in FIG. 12, although the output current of the constant current source circuit 2 decreases with rising substrate temperature, the output current is corrected so as to increase each time the substrate temperature reaches a next higher one of the temperatures T1 to T8. Thus, the output current Iout of the constant current source circuit 2 is controlled to have an amount of variation within a fixed range by switching the resistance value of the temperature compensation resistor 15.

In the constant current source circuit 2 according to the third embodiment, the temperature compensation resistor 15 whose resistance value is controlled in the semiconductor device 1 is used as a resistance for determining a magnitude of the output current Iout. Thereby, in the constant current source circuit 2 according to the third embodiment, the magnitude of the output current Iout can be controlled to have the amount of variation within the fixed range against the temperature variation.

Fourth Embodiment

Figure 13:
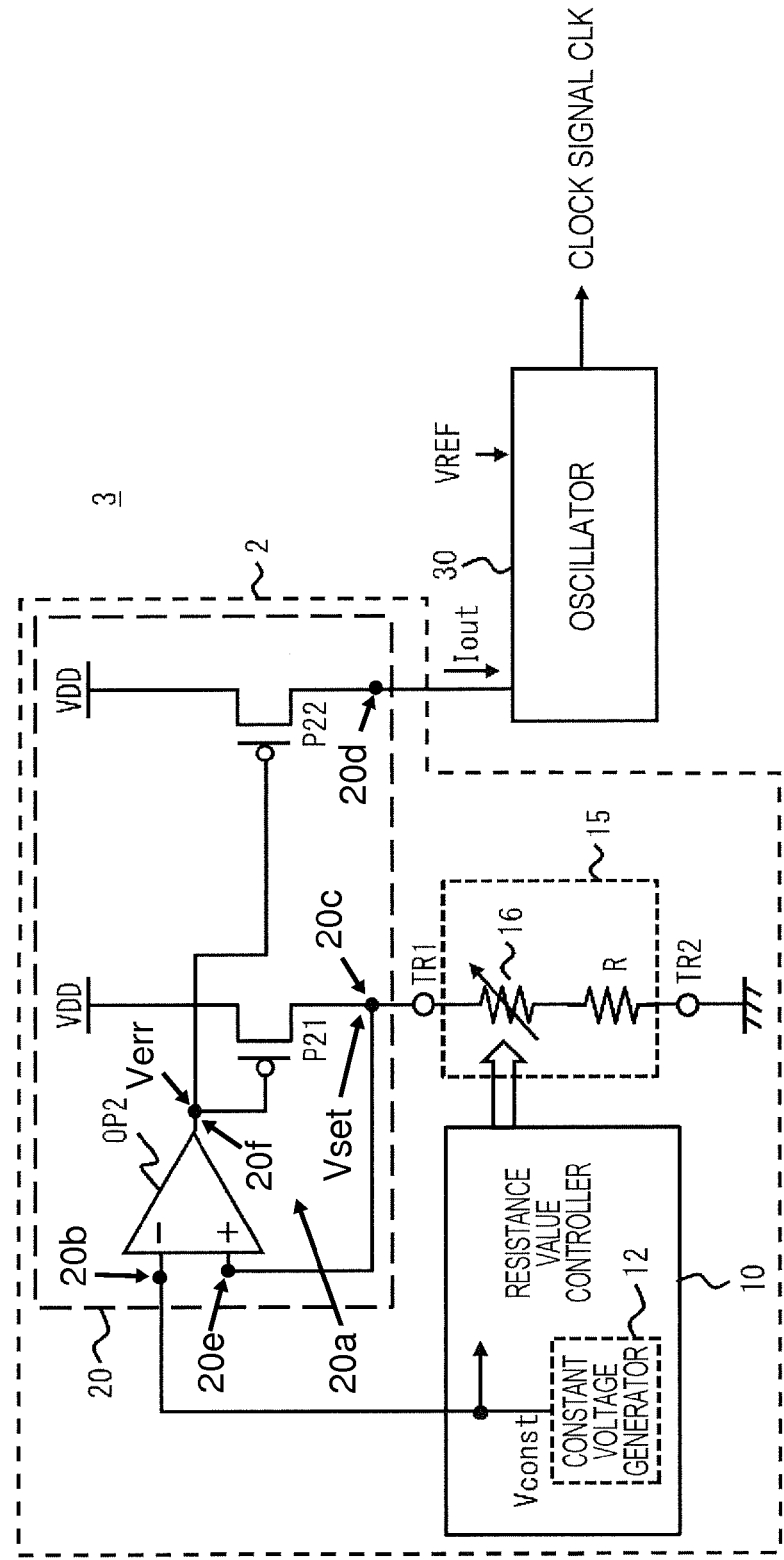
FIG. 13 is a block diagram of an oscillating circuit using the constant current source circuit shown in FIG. 11.

In a fourth embodiment, an oscillator 3 whose oscillating frequency is controlled by the output current Iout generated by the constant current source circuit 2 according to the third embodiment will be described. FIG. 13 shows a block diagram of the oscillator 3 according to the fourth embodiment. As shown in FIG. 13, the oscillator 3 has the constant current source circuit 2 according to the third embodiment and an oscillating circuit 30.

In the oscillating circuit 30, the oscillating frequency varies by the output current Iout that the constant current source circuit 2 outputs. More specifically, the oscillating circuit 30 controls the oscillating frequency based on a time constant determined by the capacitance values of first and second internal capacitors C1, C2 and the resistance value of the temperature compensation resistor 15. Here, in order to explain the oscillating circuit 30 more concretely, a block diagram of a first oscillating circuit 30a that is one mode of the oscillating circuit 30 is shown in FIG. 14.

Figure 14:
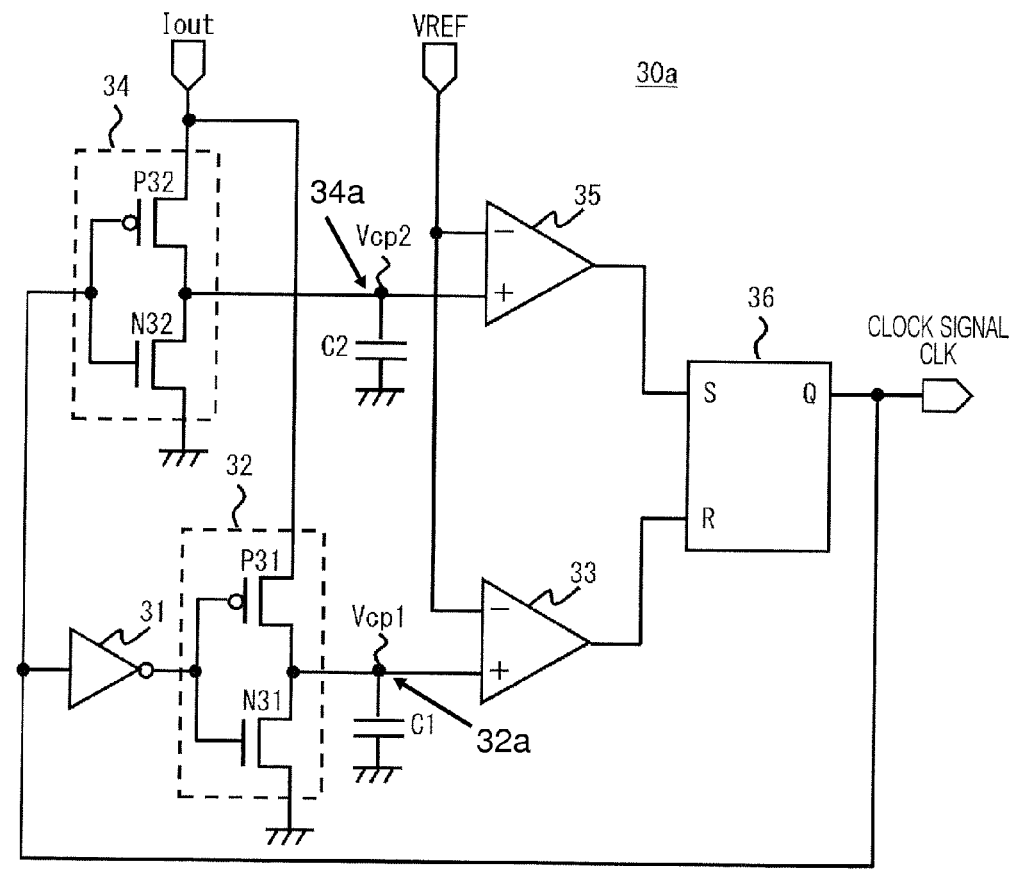
FIG. 14 is a block diagram showing one example of the oscillator shown in FIG. 13.

As shown in FIG. 14, the first oscillating circuit 30a has an inverter 31, first and second capacitor drive circuits 32, 34, first and second comparators 33, 35, an SR latch circuit 36, and the capacitors C1, C2.

The first capacitor drive circuit 32 has an NMOS transistor N31 and a PMOS transistor P31. A source of the NMOS transistor N31 is coupled to the ground terminal and its drain is coupled with a drain of the PMOS transistor P31. A coupling point of the drain of the PMOS transistor P31 and a drain of the NMOS transistor N31 is an output node 32a of the first capacitor drive circuit 32. The output current Iout that the constant current source circuit 2 outputs is inputted into a source of the PMOS transistor P31. A gate of the PMOS transistor P31 and a gate of an NMOS transistor N3 are commonly coupled, and a clock signal CLK that the oscillating circuit 30a outputs is inputted into the gates through the inverter 31. The inverter 31 outputs a signal obtained by inverting the clock signal CLK to the first capacitor drive circuit 32.

The first capacitor C1 is coupled between the output node of the first capacitor drive circuit 32 and the ground terminal. Moreover, a first capacitor voltage Vcp1 is generated at the output node according to the amount of electric charges accumulated in the first capacitor C1.

In the first comparator 33, the first capacitor voltage Vcp1 is inputted into its noninverting input terminal, and an oscillation reference voltage VREF is inputted into its inverting input terminal. Then, the first comparator 33 switches a logic level of a reset signal R according to a size relation of the voltage Vcp1 and the oscillation reference voltage VREF. More specifically, when the voltage Vcp1 is larger than the voltage VREF, the first comparator 33 sets the reset signal R to the low level. On the other hand, when the voltage Vcp1 is smaller than the oscillation reference voltage VREF, the first comparator 33 sets the reset signal R to the high level. Incidentally, it is preferable that the first comparator 33 is a hysteresis comparator in order to stably switch the logic level of the reset signal R to be outputted. Denoting a hysteresis width by dh, the hysteresis comparator switches the reset signal R from the low level to the high level when the voltage Vcp1 satisfies Vcp1>oscillation reference voltage VREF, and switches the reset signal R from the high level to the low level when the voltage Vcp1 satisfies Vcp1+dh>oscillation reference voltage VREF.

A second capacitor drive circuit 34 has an NMOS transistor N32 and a PMOS transistor P32. A source of the NMOS transistor N32 is coupled to the ground terminal and its drain is coupled to a drain of the PMOS transistor P32. A coupling point of the drain of the PMOS transistor P32 and a drain of the NMOS transistor N32 is the output node 34a of the second capacitor drive circuit 34. The output current Iout that the constant current source circuit 2 outputs is inputted into a source of the PMOS transistor P32. A gate of the PMOS transistor P32 and a gate of the NMOS transistor N32 are common-coupled, and into these gates, the clock signal CLK that the oscillating circuit 30a outputs is inputted.

The second capacitor C2 is coupled between an output node of the second capacitor drive circuit 34 and the ground terminal. Moreover, the second capacitor voltage Vcp2 is generated at the output node according to the amount of electric charges accumulated in the second capacitor C2.

In the second comparator 35, the voltage Vcp2 is inputted into the noninverting input terminal, and the oscillation reference voltage VREF is inputted into the inverting input terminal. Then, the second comparator 35 switches the logic level of the set signal S according to the size relation of the voltage Vcp2 and the oscillation reference voltage VREF. More specifically, the second comparator 35 sets the set signal S to the low level when the voltage Vcp2 is larger than the oscillation reference voltage VREF. On the other hand, the second comparator 35 sets the set signal S to the high level when the voltage Vcp2 is smaller than the oscillation reference voltage VREF. Incidentally, it is desirable that the second comparator 35 is a hysteresis comparator in order to stably switch the logic level of the set signal S that is outputted. Denoting the hysteresis width by dh, the hysteresis comparator switches the set signal S from the low level to the high level when the voltage Vcp2 satisfies Vcp2>oscillation reference voltage VREF, and switches a set signal S from the high level to the low level when the voltage Vcp1 satisfies Vcp1+dh<oscillation reference voltage VREF.

The SR latch circuit 36 inputs therein the set signal S and the reset signal R, and outputs an output signal Q. This output signal Q serves as the clock signal CLK. The SR latch circuit 36 raises the clock signal CLK according to a rising edge of the set signal S, and falls the clock signal CLK according to a rising edge of the reset signal R.

Although for the oscillation reference voltage VREF inputted into the oscillating circuit 30a, the constant voltage Vconst can also be used, it is preferable that a voltage that is inputted into the error amplifier OP2 is used. When the error amplifier OP2 has an input offset, a voltage difference arises between the constant voltage Vconst and a voltage of a noninverting input terminal of the error amplifier OP2. Moreover, the voltage of the noninverting input terminal of the error amplifier OP2 is a voltage that serves as a reference of the output current Iout. That is, the voltage of the noninverting input terminal of the error amplifier OP2 has a higher correlation with the constant current Iout of the constant current source circuit 2 than with the constant voltage Vconst. Moreover, in the oscillating circuit 30a, the oscillating frequency is determined according to the amount of current of the output current Iout of the constant current source circuit 2. With these situations, the oscillating circuit 30a can reduce an error from an expected value of the oscillating frequency by making the oscillating circuit 30a operate based on the oscillation reference voltage VREF.

Figure 15:
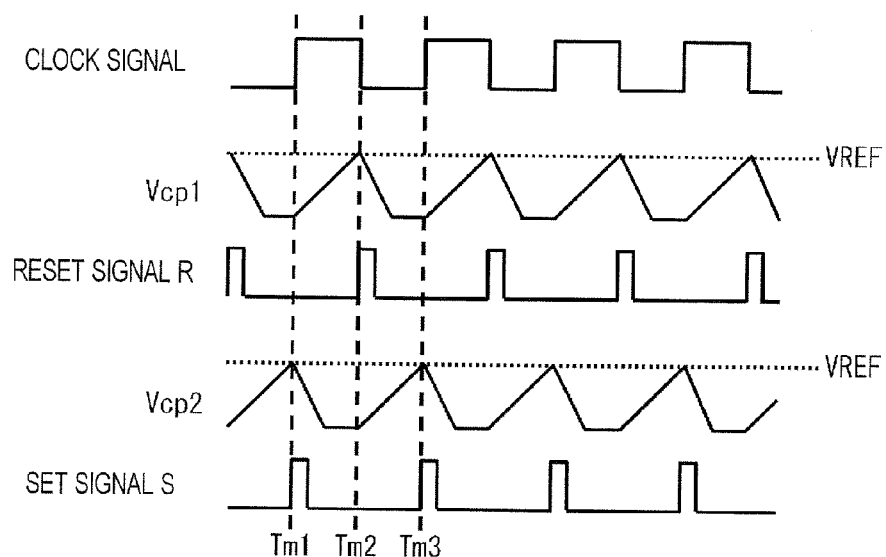
FIG. 15 is a timing chart for showing the operation of the oscillator shown in FIG. 14.

Here, FIG. 15 shows a timing chart showing an operation of the oscillating circuit 30a. First, an operation of the oscillating circuit 30a during a period when the clock signal CLK is in the low level will be explained. In the period when the clock signal CLK is in the low level, the first capacitor drive circuit 32 becomes a state where the PMOS transistor P31 turns off and the NMOS transistor N31 turns on. Then, the first capacitor drive circuit 32 extracts the electric charges from the first capacitor C1 by the NMOS transistor N31 to lower a voltage level of the voltage Vcp1. After that, when the voltage level of the voltage Vcp1 descends from the oscillation reference voltage VREF and falls below a prescribed voltage (e.g., a VREF-hysteresis width), the first comparator 33 switches the reset signal R from the high level to the low level.

Moreover, during a period when the clock signal CLK is in the low level, the second capacitor drive circuit 34 becomes a state where the PMOS transistor P32 turns on and the NMOS transistor N32 turns off. Then, the second capacitor drive circuit 34 raises the voltage level of the voltage Vcp2 by giving the output current Iout to the second capacitor C2 through the PMOS transistor P32 and thereby increasing the amount of electric charges accumulated in the second capacitor C2. After that, when a voltage level of the voltage Vcp2 reaches the oscillation reference voltage VREF, the second comparator 35 switches the set signal S from the low level to the high level (timings Tm1, Tm3).

Next, an operation of the oscillating circuit 30a during a period when the clock signal CLK is in the high level will be explained. In the period when the clock signal CLK is in the high level, the first capacitor drive circuit 32 becomes a state where the PMOS transistor P31 turns on and the NMOS transistor N31 turns off. Then, the first capacitor drive circuit 32 raises the voltage level of the voltage Vcp1 by giving the output current Iout to the first capacitor C1 through the PMOS transistor P32 and thereby increasing the amount of electric charges accumulated in the first capacitor C1. After that, when the voltage level of the voltage Vcp1 reaches the oscillation reference voltage VREF, the first comparator 33 switches the reset signal R from the low level to the high level (timing Tm2).

Moreover, during a period when the clock signal CLK is in the high level, the second capacitor drive circuit 34 becomes a state where the PMOS transistor P32 turns off and the NMOS transistor N32 turns on. Then, the second capacitor drive circuit 34 extracts the electric charges from the second capacitor C2 by the NMOS transistor N32 to lower the voltage level of the voltage Vcp2. After that, when the voltage level of the voltage Vcp2 descends from the oscillation reference voltage VREF and falls below the prescribed voltage (e.g., the VREF-hysteresis width), the second comparator 35 switches the set signal S from the high level to the low level.

The SR latch circuit 36 switches the clock signal between the high level and the low level in response to the rising edge of the above-mentioned set signal S and the rising edge of the reset signal R.

Here, in the oscillating circuit 30a, speeds of voltage rise (dV/dt) of the voltages Vcp1, Vcp2 can be expressed by a function of the output current Iout. This function is shown in Formula (3). Incidentally, in Formula (3), C represents capacitance values of the first and second capacitors C1, C2.

$$dV/dt = Iout/C \quad (3)$$

In the oscillating circuit 30a, the oscillating frequency is determined by a time necessary for the voltages Vcp1, Vcp2 to reach the oscillation reference voltage VREF from the ground voltage level. From Formula (3), if the capacitance values of the first and second capacitors C1, C2 are fixed, rising speeds of the voltages Vcp1, Vcp2 will be determined by the magnitude of the output current Iout. That is, a frequency of the clock signal that the oscillating circuit 30a outputs is determined by a current value of the output current Iout.

Figure 16:
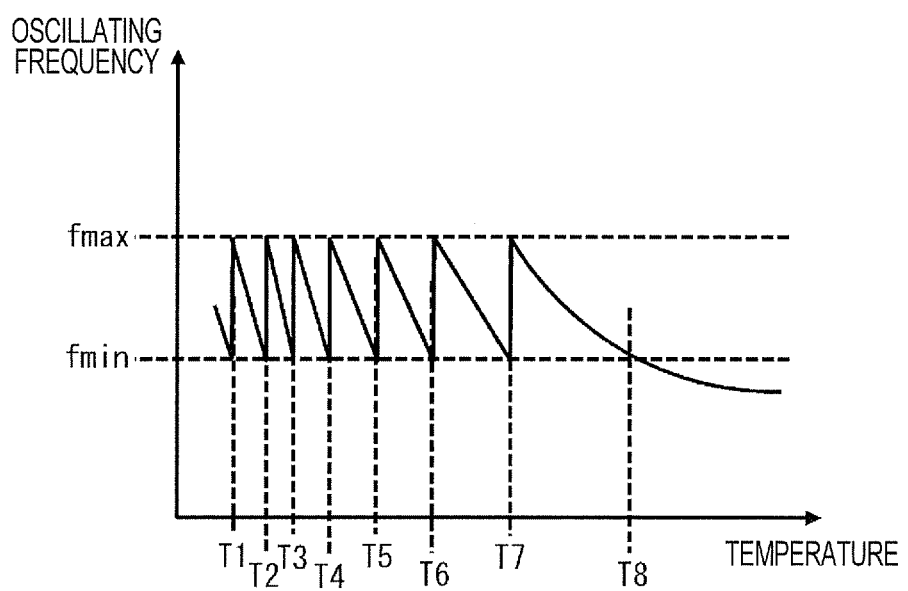
FIG. 16 is a graph for explaining a temperature variation of an oscillating frequency of the oscillator shown in FIG. 14.

Here, a temperature characteristic of the oscillating frequency of the output signal of the oscillating circuit 30a will be explained. FIG. 16 shows the temperature characteristic of the oscillating frequency of the output signal of the oscillating circuit 30a. As shown in FIG. 16, the oscillating frequency of the output signal of the oscillating circuit 30a varies according to a variation of the output current Iout of the constant current source circuit 2 shown in FIG. 12. However, since the variation of the output current Iout is suppressed within a fixed range, the oscillating frequency of the oscillating circuit 30a is also suppressed within a fixed range. It is understood that the fixed range of the oscillating frequency is limited in proportion to the preset resistance step width.

Figure 17:
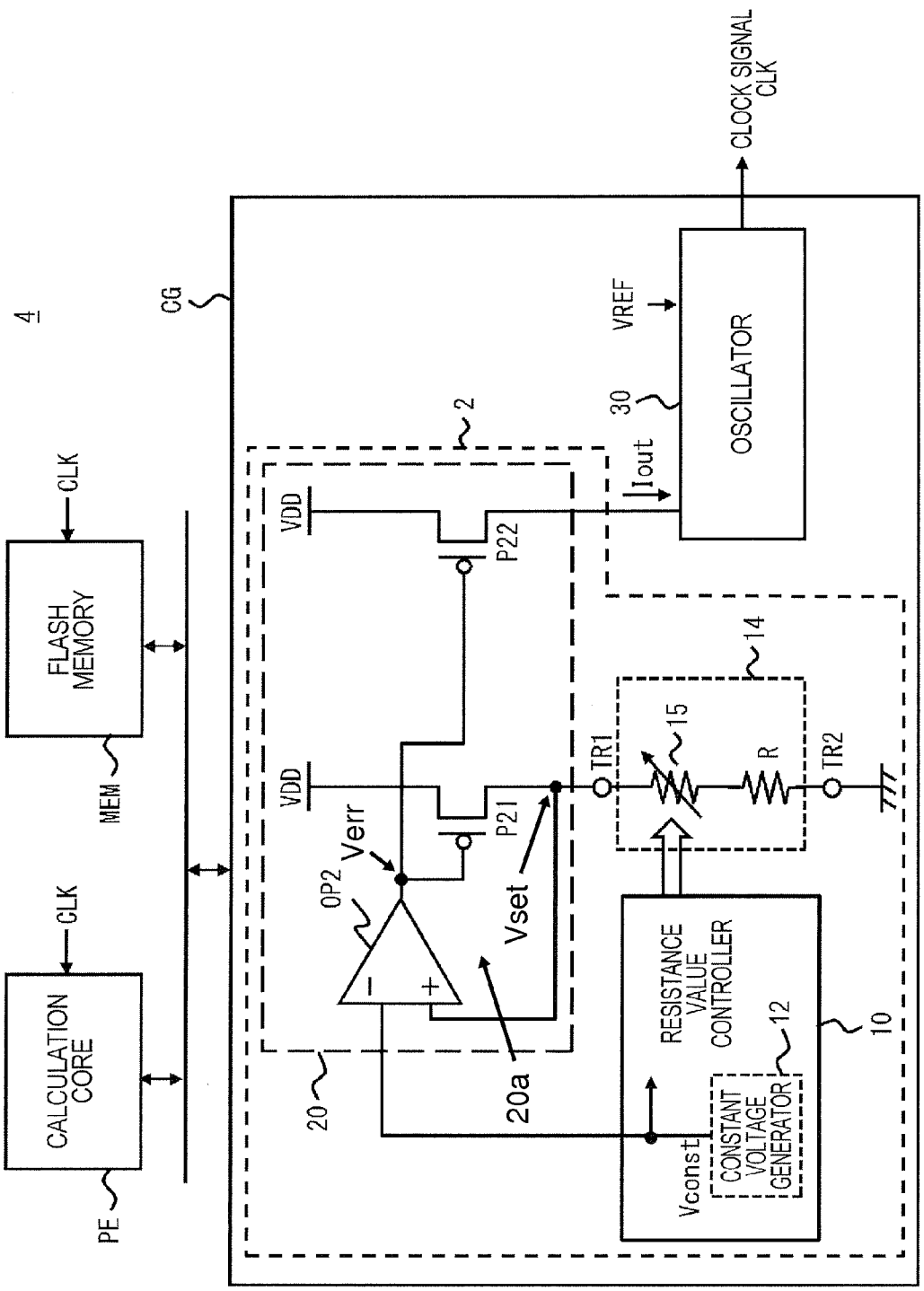
FIG. 17 is a block diagram showing one example of a microprocessor containing the oscillator shown in FIG. 14.

In the oscillator 3 according to the fourth embodiment, it is possible to realize high frequency precision (e.g., a variation width of less than 1%) by making it operate based on the output current Iout generated by the constant current source circuit 2 according to the third embodiment. Here, an example of the semiconductor device containing the oscillator 3 according to the fourth embodiment will be explained. One example of the semiconductor device containing the oscillator 3 is a microprocessor. Then, a block diagram of a microprocessor 4 is shown in FIG. 17. As shown in FIG. 17, the microprocessor 4 has a calculation core PE, memory (e.g., flash memory MEM), and a clock generation circuit CG. Then, the clock generation circuit CG contains the oscillator 3 according to the fourth embodiment. The clock generation circuit CG generates a clock signal CLK whose variation against temperature is small using the output current Iout with high precision generated in the constant current source circuit 2. In the example shown in FIG. 17, the clock signal CLK that the clock generation circuit CG outputs is supplied to the calculation core PE and the flash memory MEM. However, this clock signal CLK may be one that is outputted to the outside.

The flash memory MEM stores a program and a preset value. The calculation core PE performs an arithmetic processing based on the program stored in the flash memory. The clock generation circuit CG generates the output signal (clock signal CLK) whose oscillating frequency is determined based on the output current Iout generated by the constant current source circuit 2. The flash memory MEM, the calculation core PE, and the clock generation circuit CG are coupled to one another by an internal bus.

At this time, the semiconductor device 1 according to the first embodiment can realize the resistance value of the temperature compensation resistor 15 whose variation is small against the temperature variation, without requiring a special preset value. Therefore, when the oscillator 3 according to the fourth embodiment is used in the microprocessor 4 in this manner, the oscillator 3 can output the high-precision clock signal CLK immediately after starting. On the other hand, when entry of the preset value is required in a starting sequence in order to generate the clock signal CLK of the high-precision oscillating frequency, the preset value needs to be inputted with a provisional frequency, which causes a demerit that the starting takes time.

Fifth Embodiment

Figure 18:
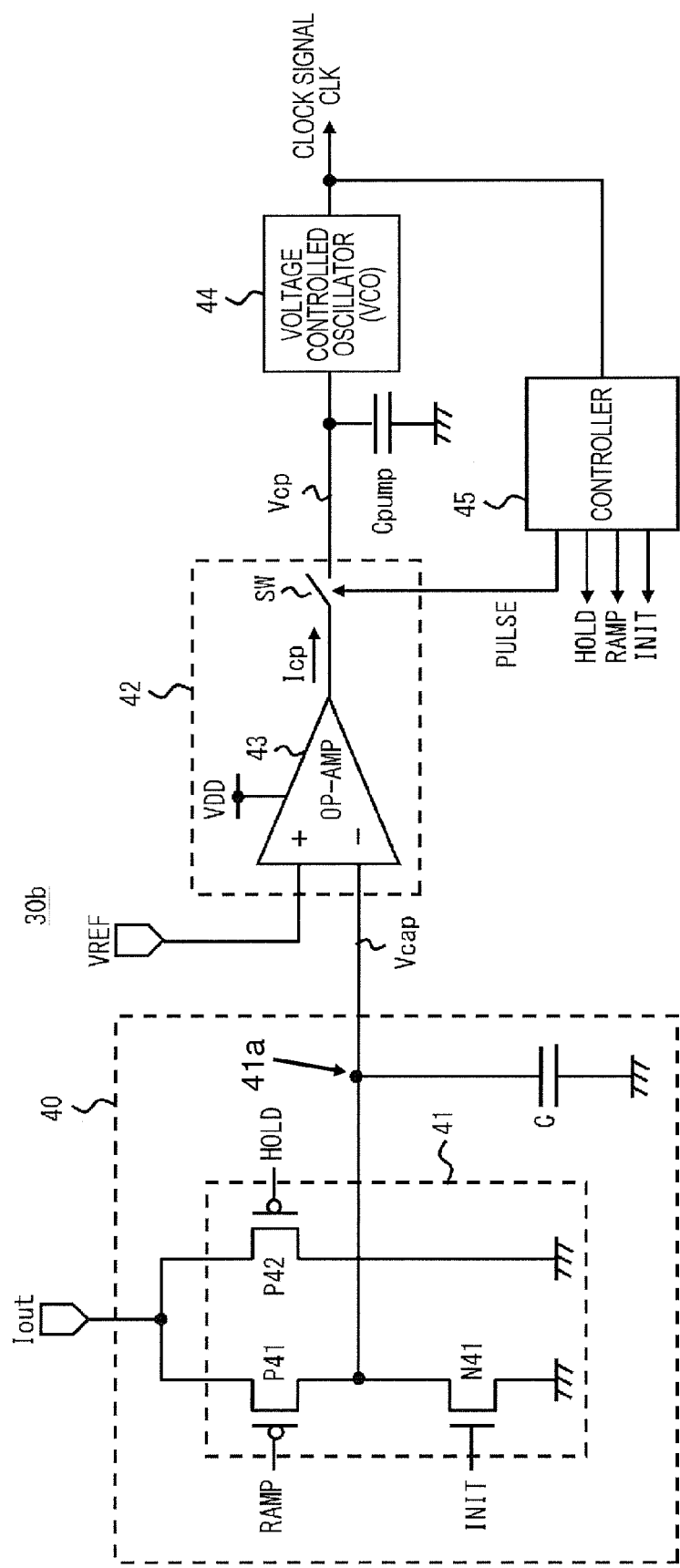
FIG. 18 is a block diagram showing another example of the oscillator shown in FIG. 13.

In the fifth embodiment, a second oscillating circuit 30b that is another embodiment of the oscillating circuit 30 will be described. FIG. 18 shows a block diagram showing the oscillating circuit 30b that is another embodiment of the oscillating circuit 30. As shown in FIG. 18, the oscillating circuit 30b has a frequency detecting circuit 40, a differential amplifier 42, a voltage controlled oscillator 44, a controller 45, and a filter capacitor Cpump.

The frequency detecting circuit 40 generates a frequency detection voltage Vcap whose voltage level varies according to the length of a cycle of the clock signal CLK based on a timing control signal that the controller 45 outputs. Incidentally, the timing control signal includes an electric charge reset signal INIT, a ramp control signal RAMP, and a hold control signal HOLD, and the frequency detecting circuit 40 generates the frequency detection voltage Vcap according to these signals.

As shown in FIG. 18, the frequency detecting circuit 40 has a ramp and hold circuit 41 and a frequency setting capacitor C. The output current Iout is inputted into the ramp and hold circuit 41 from the constant current source circuit 2. That is, in the ramp and hold circuit 41, a current value of a charge/discharge current is set by the output current Iout.

The ramp and hold circuit 41 performs a supply of the charge/discharge current to the frequency setting capacitor C and a reset of the electric charges accumulated in the frequency setting capacitor C based on the timing control signal. The ramp and hold circuit 41 has an NMOS transistor N41 and PMOS transistors P41, P42. The PMOS transistors P41, P42 form a differential pair. That is, in the PMOS transistors P41, P42, their sources are common-coupled. Then, the output current Iout is supplied to the sources (a common coupling point) of the PMOS transistors P41, P42. The ramp control signal RAMP is inputted into a gate of the PMOS transistor P41, and the hold control signal HOLD is inputted into a gate of the PMOS transistor P42. A drain of the NMOS transistor N41 is coupled to a drain of the PMOS transistor P41 and serves as an output terminal 41a of the ramp and hold circuit 41. A drain of the PMOS transistor P42 is coupled to the ground terminal. The electric charge reset signal INIT is inputted into a gate of the NMOS transistor N41. A source of the NMOS transistor N41 is coupled to the ground terminal.

The frequency setting capacitor C is coupled between the output terminal 41a of the ramp and hold circuit 41 and the ground terminal. Then, the frequency setting capacitor C generates the frequency detection voltage Vcap depending on the amount of accumulated electric charges. Incidentally, the frequency detection voltage Vcap is generated at a node serving as the output terminal 41a of the ramp and hold circuit 41.

The ramp and hold circuit 41 turns on the NMOS transistor N41 when the electric charge reset signal INIT becomes enabled (e.g., in the high level). Then, the ramp and hold circuit 41 resets the electric charges accumulated in the frequency setting capacitor by discharging the electric charges accumulated in the frequency setting capacitor C. Moreover, when the electric charge reset signal INIT becomes disabled (e.g., in the low level) and the ramp control signal RAMP becomes enabled (e.g., in the low level), the ramp and hold circuit 41 turns off the NMOS transistor N41 and turns on the PMOS transistor P41. Thereby, the ramp and hold circuit 41 accumulates the electric charges to the frequency setting capacitor C by the charge/discharge current. Moreover, when the ramp control signal RAMP becomes disabled (e.g., in the high level) and the hold control signal HOLD becomes enabled (e.g., in the low level), the ramp and hold circuit 41 turns off the PMOS transistor P41 and turns on the PMOS transistor P42. Thereby, the ramp and hold circuit 41 suspends charging to the frequency setting capacitor C, and maintains the frequency detection voltage Vcap that is produced by the electric charges accumulated in the frequency setting capacitor C.

The differential amplifier 42 controllably varies an oscillating frequency setting current Icp continuously according to a voltage difference between the frequency detection voltage Vcap and the oscillation reference voltage VREF, and outputs it to the filter capacitor Cpump. More specifically, the differential amplifier 42 has an amplifier 43 and a switching circuit SW. Then, the frequency detection voltage Vcap is inputted into an inverting input terminal of the amplifier 43, and the oscillation reference voltage VREF is inputted into its noninverting input terminal. The amplifier 43 is, for example, a transconductance amplifier and outputs the oscillating frequency setting current Icp that has a current value according to the voltage difference between the frequency detection voltage Vcap and the oscillation reference voltage VREF.

Incidentally, in this fifth embodiment, a voltage of the noninverting input terminal of the error amplifier OP2 of the constant current source circuit 2 is used as this oscillation reference voltage VREF. The voltage of the noninverting input terminal of the error amplifier OP2 is substantially the same as the constant voltage Vconst. However, when the error amplifier OP2 has the input offset, a voltage difference arises between the constant voltage Vconst and the voltage of the noninverting input terminal of the error amplifier OP2. Moreover, the voltage of the noninverting input terminal of the error amplifier OP2 is a voltage that serves as a reference of the output current Iout. That is, the voltage of the noninverting input terminal of the error amplifier OP2 has a higher correlation with the output current Iout of the constant current source circuit 2 than with the constant voltage Vconst. Moreover, in the oscillating circuit 30b, the oscillating frequency is determined according to the amount of current of the output current Iout of the constant current source circuit 2. Because of such a situation, it is possible for the oscillating circuit 30b to reduce an error from the expected value of the oscillating frequency by making the oscillating circuit 30b operate based on the oscillation reference voltage VREF.

The switching circuit SW is provided between an output terminal of the amplifier 43 and the filter capacitor Cpump and its conduction state is switched over according to the pump control signal PULSE contained in the timing control signal from the controller 45. More specifically, the switching circuit SW is in the conduction state when the pump control signal PULSE becomes enabled (e.g., in the high level), and is in the cut-off state when becoming disabled (e.g., in the low level).

The oscillator 44 controls the oscillating frequency of the clock signal CLK according to the voltage level of the oscillating frequency control voltage Vcp.

The controller 45 generates the timing control signal that switches the logic level based on the cycle of the clock signal CLK. This timing control signal contains the electric charge reset signal INIT, a ramp control signal RAMP, a hold control signal HOLD, and a pump control signal PULSE. The controller 45 generates a frequency-divided signal that is obtained by frequency-dividing the clock signal CLK, and switches the logic level of the above-mentioned control signal based on a count value obtained by counting the number of clocks of the frequency-divided signal. Details of switching timing of a logic level of the timing control signal will be described later.

Figure 19:
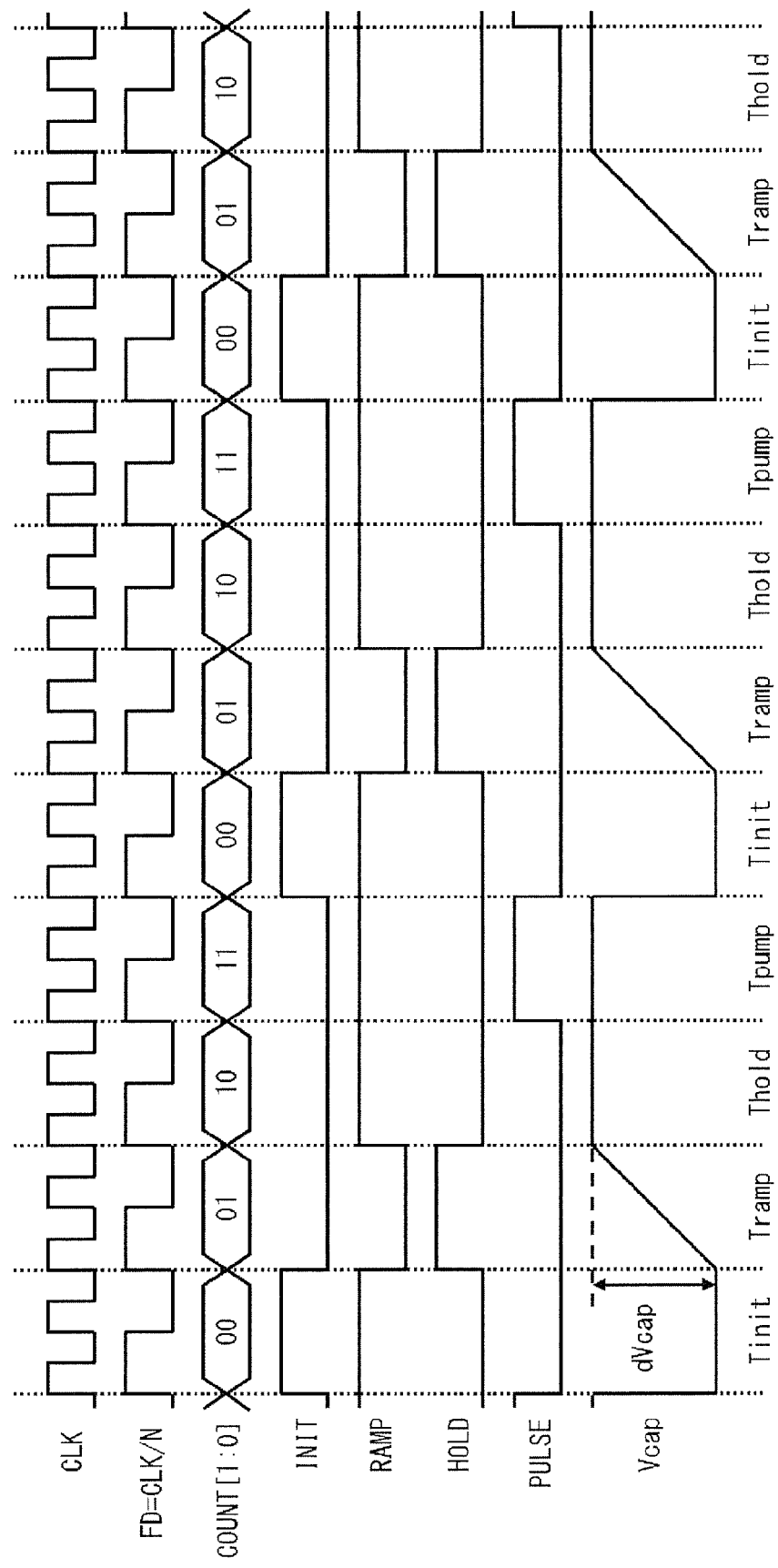
FIG. 19 is a timing chart for showing an operation of a controller of the oscillator shown in FIG. 18.

Next, FIG. 19 shows a timing chart showing operations of the frequency detecting circuit 40 and the controller 45. Then, with reference to FIG. 19, the switching timing of the logic level of the timing control signal performed by the controller 45 and an operation of the frequency detecting circuit 40 will be explained.

As shown in FIG. 19, the controller 45 generates a frequency-divided signal FD by frequency-dividing the clock signal CLK. In the example shown in FIG. 19, the frequency-divided signal FD is generated by frequency-dividing the clock signal CLK by two. Moreover, the controller 45 counts the number of clocks of the frequency-divided signals FD, and generates a count value COUNT. In the example shown in FIG. 19, the count value COUNT is a 2-bit value, which takes values of 0 to 3. Then, the controller 45 switches the logic level of the timing control signal according to a value of the count value COUNT.

Specifically, when the count value is zero, the controller 45 sets the electric charge reset signal INIT to the high level (enabled state), sets the ramp control signal RAMP to the high level (disabled state), sets the hold control signal HOLD to the low level (enabled state), and sets the pump control signal PULSE to the low level (disabled state). Below, a period when the count value is zero is called an electric charge reset period Tinit.

When the count value is unity, the controller 45 sets the electric charge reset signal INIT to the low level (disabled state), sets the ramp control signal RAMP to the low level (enabled state), sets the hold control signal HOLD to the high level (disabled state), and sets the pump control signal PULSE to the low level (disabled state). Below, a period when the count value is unity is called a ramp period Tramp.

When the count value is two, the controller 45 sets the electric charge reset signal INIT to the low level (disabled state), sets the ramp control signal RAMP to the high level (disabled state), sets the hold control signal HOLD to the low level (enabled state), and sets the pump control signal PULSE to the low level (disabled state). Below, a period when the count value is two is called a hold period Thold.

When the count value is three, the controller 45 sets the electric charge reset signal INIT to the low level (disabled state), sets the ramp control signal RAMP to the high level (disabled state), sets the hold control signal HOLD to the low level (enabled state), and sets the pump control signal PULSE to the high level (enabled state). Below, a period when the count value is three is called a pump period Tpump.

Next, an operation of the frequency detecting circuit 40 will be explained. In the electric charge reset period Tinit, the frequency detecting circuit 40 resets the electric charges accumulated in the frequency setting capacitor C to the amount of electric charges according to the ground voltage by bringing the NMOS transistor N41 into conduction based on the electric charge reset signal INIT. Thereby, the frequency detection voltage Vcap becomes a voltage almost equal to the ground voltage. At this time, the PMOS transistor P41 turns off in response to the ramp control signal RAMP, and the PMOS transistor P42 turns on in response to the hold control signal HOLD.

Then, in the ramp period Tramp, the frequency detecting circuit 40 turns off the NMOS transistor N41 in response to the electric charge reset signal INIT, turns on the PMOS transistor P41 in response to the ramp control signal RAMP, and turns off the PMOS transistor P42 in response to the hold control signal HOLD. That is, the frequency detecting circuit 40 charges electric charges to the frequency setting capacitor C based on the charge/discharge current during the ramp period Tramp. Thereby, a voltage level of the frequency detection voltage Vcap rises gradually. A gradient in which the frequency detection voltage Vcap rises is determined by a magnitude of the charge/discharge current and a capacitance value of the frequency setting capacitor C. For example, the gradient (dVcap/dt) of the frequency detection voltage Vcap is expressed by dVcap/dt=Tout/C. Moreover, during the ramp period Tramp, although the voltage level of the frequency detection voltage Vcap rises, a rate of voltage decline is constant. Therefore, the amount of voltage reduction dVcap of the frequency detection voltage Vcap during the ramp period Tramp is determined by a length of the ramp period Tramp (the oscillating frequency of the clock signal CLK).

Then, during the hold time Thold, the frequency detecting circuit 40 turns off the NMOS transistor N41 in response to the electric charge reset signal INIT, turns off the PMOS transistor P41 in response to the ramp control signal RAMP, and turns on the PMOS transistor P42 in response to the hold control signal HOLD. That is, during the hold time Thold, the frequency detecting circuit 40 sets the node 41*a* to which the frequency setting capacitor C is coupled in a high impedance state, and maintains the voltage level of the frequency detection voltage Vcap generated by the frequency setting capacitor C.

Then, during the pump period Tpump, a supply of the oscillating frequency setting current Icp to the filter capacitor Cpump by the differential amplifier 42 is performed. At this time, the electric charge reset signal INIT, the ramp control signal RAMP, and the hold control signal HOLD all of which are given to the frequency detecting circuit 40 are the same between during the hold time Thold and during the pump period Tpump. Therefore, it does not occur that during the pump period Tpump, the voltage level of the frequency detection voltage Vcap varies by the frequency detecting circuit 40.

Figure 20:
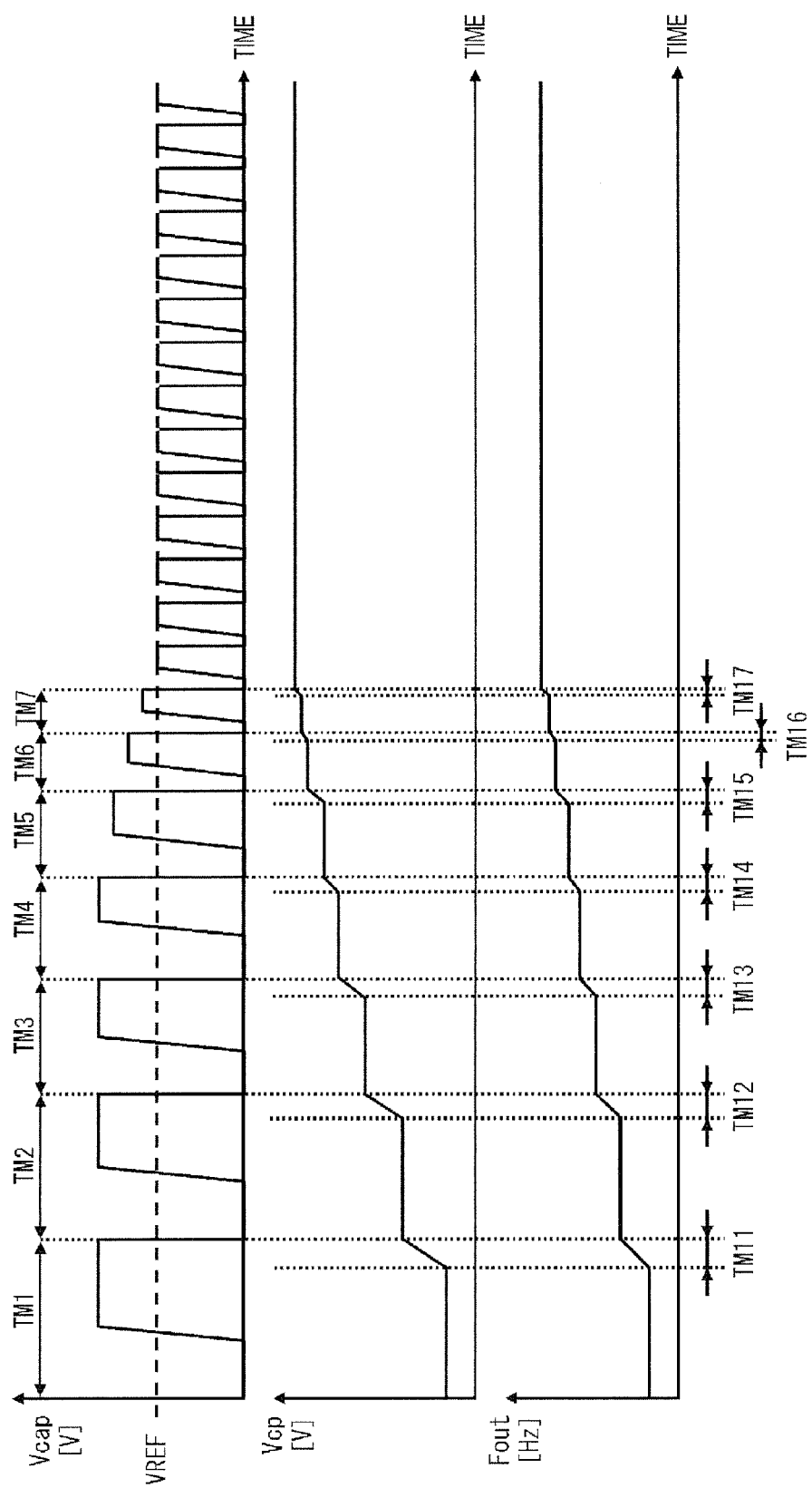
FIG. 20 is a timing chart for showing the operation of the oscillator shown in FIG. 19.

Next, an overall operation of the oscillating circuit 30*b* shown in FIG. 18 will be explained. FIG. 20 shows a timing chart showing an operation of the oscillating circuit 30*b* shown in FIG. 18. The timing chart shown in FIG. 20 shows only variations of the frequency detection voltage Vcap, the oscillating frequency control voltage Vcp, and the clock signal CLK. Moreover, in FIG. 20, the operation of the oscillating circuit 30*b* shall be started in the origin of a time axis (horizontal axis).

As shown in FIG. 20, the oscillating circuit 30*b* raises the oscillating frequency control voltage Vcp in every period of periods TM1 to TM7. Each period of the periods TM1 to TM7 contains one set of the reset period Tinit, the ramp period Tramp, the hold period Thold, and the pump period Tpump all of which are shown in FIG. 19. Moreover, since the frequency of the clock signal CLK rises in every period, the period become shorter gradually, from the period TM1 to the period TM7. This is because the timing control signal is generated based on the cycle of the clock signal CLK. Incidentally, the periods TM11 to TM17 shown in FIG. 20 makes up a period corresponding to the pump period Tpump.

Then, after the period TM7 elapses, a high level side voltage of the frequency detection voltage Vcap becomes almost the same as the oscillation reference voltage VREF. Thereby, in the oscillating circuit 30*b*, the oscillating frequency setting current Icp that the differential amplifier 42 outputs becomes almost zero. Therefore, after the high level side voltage of the frequency detection voltage Vcap becomes almost the same as the oscillation reference voltage VREF, its state is maintained. Moreover, since the frequency detection voltage Vcap is maintained at a constant voltage, the oscillating frequency of the clock signal CLK is also maintained constant. That is, in the oscillating circuit 30*b*, after the oscillating frequency of the clock signal CLK reaches a desired value, a jitter does not arise in the clock signal CLK.

From the above-mentioned explanation, in the oscillating circuit 30*b*, the filter capacitor Cpump generates the oscillating frequency control voltage Vcp according to the oscillating frequency setting current Icp. At this time, in the oscillating circuit 30*b*, the differential amplifier 42 outputs the oscillating frequency setting current Icp whose value varies continuously according to the voltage difference between the frequency detection voltage Vcap and the oscillation reference voltage VREF. That is, if there is the voltage difference between the frequency detection voltage Vcap and the oscillation reference voltage VREF, the oscillating frequency setting current Icp will have a magnitude according to the voltage difference; if there is no voltage difference between the frequency detection voltage Vcap and the oscillation reference voltage VREF, the oscillating frequency setting current Icp will become substantially zero. Thereby, in the oscillating circuit 30*b*, in a state where the frequency of the clock signal CLK coincides with the desired value (e.g., a state where the frequency detection voltage Vcap coincides with the oscillation reference voltage VREF), even if the pump control signal PULSE is in an enabled state, a variation does not arise in the oscillating frequency control voltage Vcp. By this, in the oscillating circuit 30b, after the oscillating frequency of the clock signal CLK agrees with the desired value, the voltage value of the oscillating frequency control voltage Vcp does not vary and the oscillating frequency of the clock signal CLK that the oscillator 44 determines according to the voltage value of the oscillating frequency control voltage Vcp does not shift, either. That is, the oscillating circuit 30b can reduce the jitter of the clock signal CLK.

Moreover, in the oscillating circuit 30b, the differential amplifier 42 has the switching circuit SW. This switching circuit SW is controlled to be in the cut-off state other than a period when a differential voltage amplification result of the input signal of the differential amplifier 42 is reflected (e.g., during the pump period Tpump). In the oscillating circuit 30b, the frequency detection voltage Vcap becomes a voltage value shifted from a voltage that reflects the clock signal CLK in the electric charge reset period Tinit and in the ramp period Tramp. However, since the switching circuit SW is controlled to be in the cut-off state except during the pump period, a discrepancy of the frequency detection voltage Vcap between during the electric charge reset period Tinit and during the ramp period Tramp can be prevented from being reflected in the oscillating frequency. Thereby, in the oscillating circuit 30b, the oscillating frequency can be stabilized in any period.

Moreover, the oscillating circuit 30b sets up the oscillating frequency based on the output current Iout that the constant current source circuit 2 outputs. Here, a coefficient of variation of the output current Iout that the constant current source circuit 2 outputs against the temperature variation is very small in connection with the temperature variation range of the resistance value of the temperature compensation resistor 15. Therefore, it is possible to make the coefficient of variation for a temperature variation of the oscillating frequency of the oscillating circuit 30b very small (e.g., a variation width of less than 1%).

Sixth Embodiment

In a sixth embodiment, a third oscillating circuit 30c will be described. Although the oscillating circuit 30c has the same circuit configuration as that of the oscillating circuit 30b, the oscillating frequency of the output signal varies based on the output current Iout that a current generating circuit 5 for supplying the operating current outputs. The current generating circuit 5 according to the sixth embodiment determines a value of the output current Iout with the semiconductor device 1 according to the first embodiment. In addition, in the explanation of the sixth embodiment, an explanation of the oscillating circuit 30c other than the current generating circuit 5 is omitted.

Incidentally, the oscillating circuit 30c has a frequency detecting circuit 50 corresponding to the frequency detecting circuit 40, a ramp and hold circuit 51 corresponding to the ramp and hold circuit 41, a differential amplifier 52 corresponding to the differential amplifier 42, an amplifier 53 corresponding to the amplifier 43, a voltage controlled oscillator 54 corresponding to the voltage controlled oscillator 44, and a controller 55 corresponding to the controller 45. Moreover, an NMOS transistor N51 has a function corresponding to that of the PMOS transistor P41, an NMOS transistor N52 has a function corresponding to that of the PMOS transistor P42, and a PMOS transistor P51 has a function corresponding to that of the NMOS transistor N41.

Figure 21:
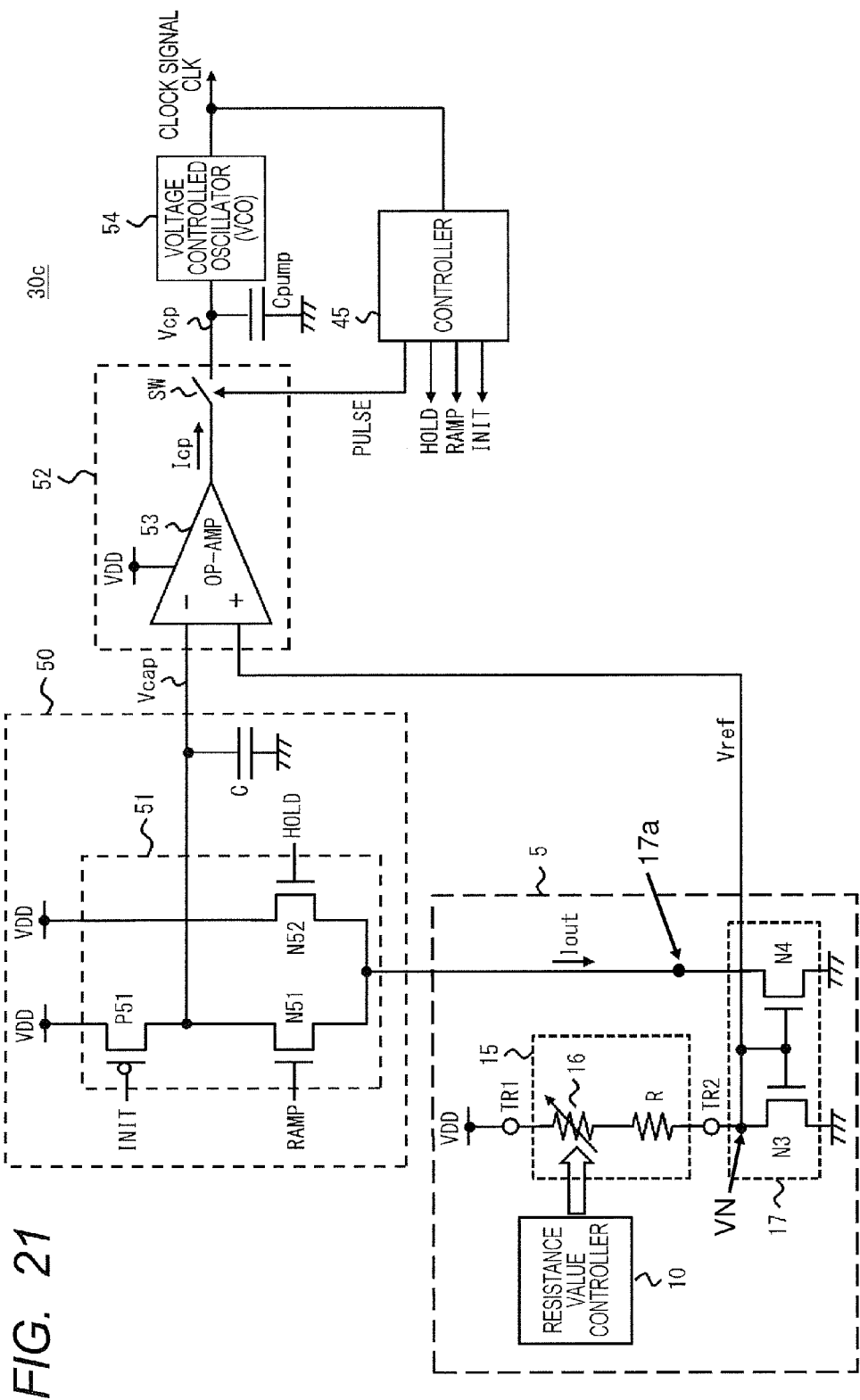
FIG. 21 is a block diagram showing another example of the oscillating circuit using the constant current source circuit that contains the semiconductor device according to the first embodiment.

FIG. 21 shows a block diagram of the oscillating circuit 30c according to the sixth embodiment. As shown in FIG. 21, the oscillating circuit 30c has the current generating circuit 5. The current generating circuit 5 has the resistance value controller 10 and the temperature compensation resistor 15 of the semiconductor device 1. Moreover, the current generating circuit 5 has a current mirror circuit 17.

The current mirror circuit 17 has first and second NMOS transistors N3, N4. Sources of the NMOS transistors N3, N4 are coupled to the ground terminal. Gates of the NMOS transistors N3, N4 are common-coupled. Moreover, in the first NMOS transistor N3, its gate and drain are coupled to each other. A drain of the second NMOS transistor N4 serves as an output terminal 17a of the current mirror circuit 17, and outputs the output current Iout.

Then, in the current generating circuit 5, the temperature compensation resistor 15 is coupled between the power supply terminal and a drain of the first NMOS transistor N3. Thereby, the magnitude of the output current Iout of the current generating circuit 5 becomes a value obtained by dividing a voltage difference between the supply voltage VDD and a threshold voltage VN of the first NMOS transistor N3, by the resistance value of the temperature compensation resistor 15 (Iout=(VDD−VN)/R). At this time, the semiconductor device 1 is capable of suppressing the temperature variation of the resistance value of the temperature compensation resistor 15. Therefore, the output current Iout of the current generating circuit 5 can be made less susceptible to an influence of the temperature variation of the resistance value of the temperature compensation resistor 15.

On the other hand, the output current Iout of the current generating circuit 5 is subjected to an influence of a temperature variation of the threshold voltage VN of the first NMOS transistor N3. Generally, this is because a threshold voltage of a transistor varies against the variation of the substrate temperature, much like a forward voltage of a diode.

Here, as shown in FIG. 21, in the oscillating circuit 30c according to the sixth embodiment, the gate voltage of the first NMOS transistor N3 of the current mirror circuit 17 is used as the oscillation reference voltage VREF that is inputted into the amplifier 53. The magnitude of the output current Iout varies following the variation of the threshold voltage VN of the first NMOS transistor N3. However, by using the threshold voltage VN of the first NMOS transistor N3 as the oscillation reference voltage VREF, a discrepancy of the charge/discharge time of the frequency setting capacitor resulting from the variation of the output current Iout can be cancelled out. Thereby, the oscillating circuit 30c according to the sixth embodiment can stabilize the oscillating frequency of the output signal, without being affected by the variation of the threshold voltage VN of the first NMOS transistor N3.

From the above-mentioned explanation, it is possible for the current generating circuit 5 according to the sixth embodiment to suppress an influence of the temperature variation of the resistance value on the output current Iout by setting the magnitude of the output current Iout by the temperature compensation resistor 15 whose resistance value is controlled by the semiconductor device 1 according to the first embodiment. Moreover, in the oscillating circuit 30c according to the sixth embodiment, the influence of the temperature variation of the threshold voltage VN of the first NMOS transistor N3 on the oscillating frequency of the output signal can be suppressed by setting the threshold voltage VN of the first NMOS transistor N3 of the current generating circuit 5 to the oscillation reference voltage VREF.

Seventh Embodiment

Figure 22:
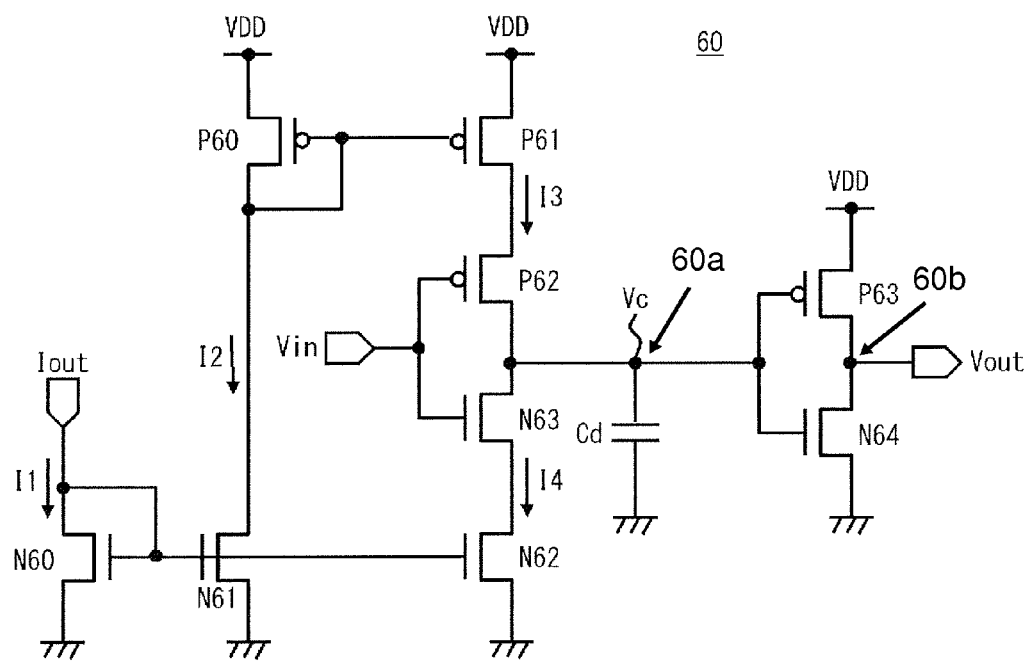
FIG. 22 is a block diagram of a delay circuit that receives a supply of an operating current from the constant current source circuit shown in FIG. 11.

In the seventh embodiment, a delay circuit 60 for delaying a signal by a delay amount determined by the amount of current of the output current Iout generated by the constant current source circuit 2 will be described. FIG. 22 shows a circuit diagram of the delay circuit 60. As shown in FIG. 22, the delay circuit 60 has NMOS transistors N60 to N64, PMOS transistors P60 to P63, and a capacitor Cd.

In the NMOS transistor N60, its source is coupled to the ground terminal and its gate and drain are coupled to each other. The output current Iout of the constant current source circuit 2 is inputted into the drain of the NMOS transistor N60. Below, this output current Iout is called a current I1. The NMOS transistors N61, N62 form the current mirror circuit together with the NMOS transistor N60.

In the PMOS transistor P60, its source is coupled to the ground terminal and its drain and gate are coupled to each other. The drain of the PMOS transistor P60 is coupled with a drain of the NMOS transistor N61. Then, a current I2 flowing in the NMOS transistor N61 is inputted into the drain of the PMOS transistor P60. A current mirror circuit comprised of the NMOS transistors N60, N61 generates this current I2 based on the current I1. The PMOS transistor P61 forms a current mirror circuit together with the PMOS transistor P60.

A source of the NMOS transistor N63 is coupled to a drain of the NMOS transistor N62. A drain of the NMOS transistor N63 is coupled to a drain of the PMOS transistor P62. A source of the PMOS transistor P62 is coupled to a drain of the PMOS transistor P61. A gate of the NMOS transistor N62 and a gate of the PMOS transistor P62 are coupled to each other, and an input signal Vin is given to these gates. A coupling point of a drain of the PMOS transistor P62 and the drain of the NMOS transistor N63 serves as an intermediate output node 60a (a node where an intermediate voltage Vc is generated). Moreover, a current I4 that a current mirror circuit comprised of the NMOS transistors N60, N62 generates based on the current I1 flows in the NMOS transistor N63. A current I3 that a current mirror circuit comprised of PMOS transistors P60, P61 generates based on the current I2 flows in the PMOS transistor P62.

The capacitor Cd is coupled between the intermediate output node 60a and the ground terminal. A source of the NMOS transistor N64 is coupled to the ground terminal. A drain of the NMOS transistor N64 is coupled to a drain of the PMOS transistor P63. A source of the PMOS transistor P63 is coupled to the power supply terminal. A gate of the NMOS transistor N64 and a gate of the PMOS transistor P63 are coupled to each other, and the intermediate output node 60a is coupled to these gates.

The coupling point of the drain of the PMOS transistor P63 and the drain of the NMOS transistor N64 is an output terminal 60b of the delay circuit 60, from which an output signal Vout is outputted. That is, the NMOS transistor N64 and the PMOS transistor P63 form an output inverter of the delay circuit 60.

Figure 23:
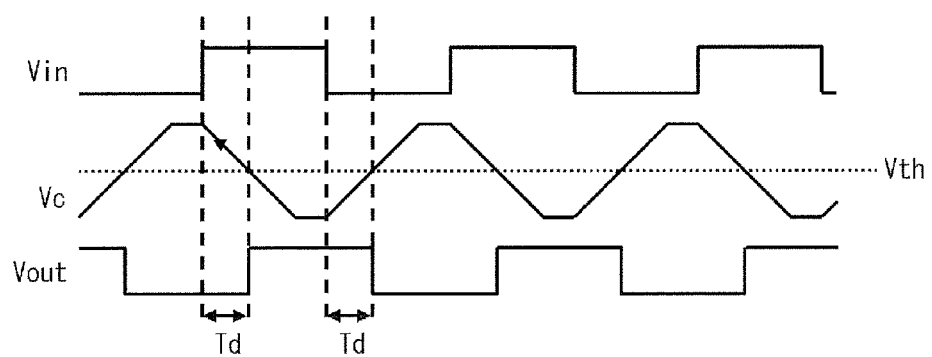
FIG. 23 is a timing chart showing an operation of the delay circuit shown in FIG. 22.

Next, an operation of the delay circuit 60 will be explained. FIG. 23 shows a timing chart showing the operation of the delay circuit 60. As shown in FIG. 23, during a period when the input signal Vin is in the low level, the delay circuit 60 turns off the NMOS transistor N63 and turns on the PMOS transistor P62. Then, electric charges are accumulated in the capacitor Cd by the current I3 flowing through the PMOS transistor P62. Thereby, the intermediate voltage Vc rises gradually. After that, when the intermediate voltage Vc exceeds a threshold voltage Vth of the output inverter, the output signal Vout falls.

Moreover, during a period when the input signal Vin is in the high level, the delay circuit 60 turns on the NMOS transistor N63 and turns off the PMOS transistor P62. Then, the electric charges accumulated in the capacitor Cd by the current I4 flowing through the NMOS transistor N63 are discharged. Thereby, the intermediate voltage Vc lowers gradually. After that, when the intermediate voltage Vc falls below the threshold voltage Vth of the output inverter, the output signal Vout rises.

Here, the delay circuit 60 performs charging to the capacitor Cd with the current I3, and performs discharging from the capacitor Cd with the current I4. Both of these currents I3, I4 are generated by the current mirror circuit based on the current I1. When a current mirror ratio is 1:1 in either current mirror circuit, the currents I3, I4 have the same current value as the current I1. Therefore, the gradient of rising of, and the gradient of falling of, the intermediate voltage Vc can be expressed by $dVc/dt = Iout/C$.

From the above-mentioned explanation, in the delay circuit 60, the delay time Td is a time from the rising edge or falling edge of the input signal Vin to a point when the intermediate voltage Vc exceeds the threshold voltage Vth of the output inverter. That is, if the coefficient of variation of the output current Iout (current I1) against the temperature variation is substantially zero, the delay circuit 60 can keep the delay time Td constant regardless of the temperature. Moreover, if the current value of the output current Iout is set precisely, the delay circuit 60 can set a high-precision delay time Td. Such a delay circuit 60 can also be built in the microprocessor 4 according to the second embodiment.

Eighth Embodiment

Figure 24:
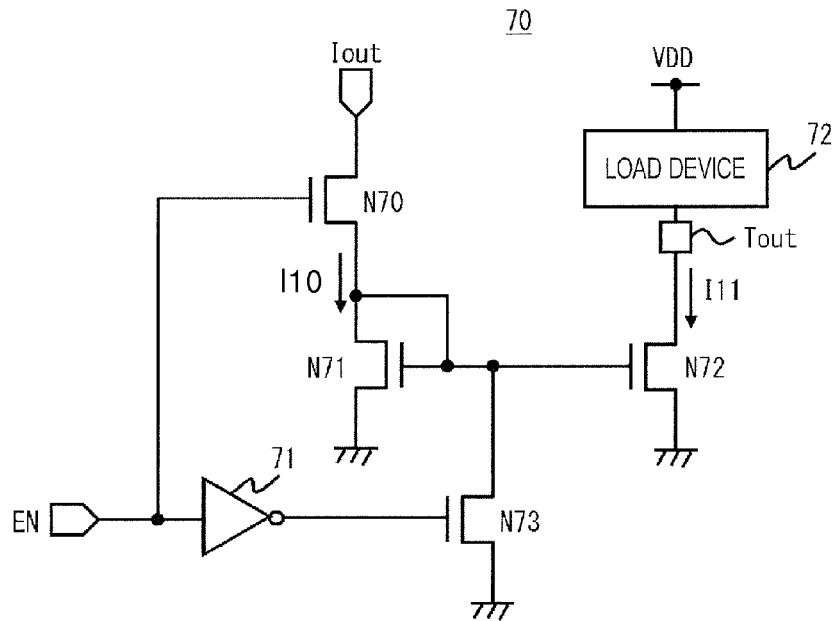
FIG. 24 is a block diagram of an output stage circuit that receives the supply of the operating current from the constant current source circuit shown in FIG. 11.
Figure 25:
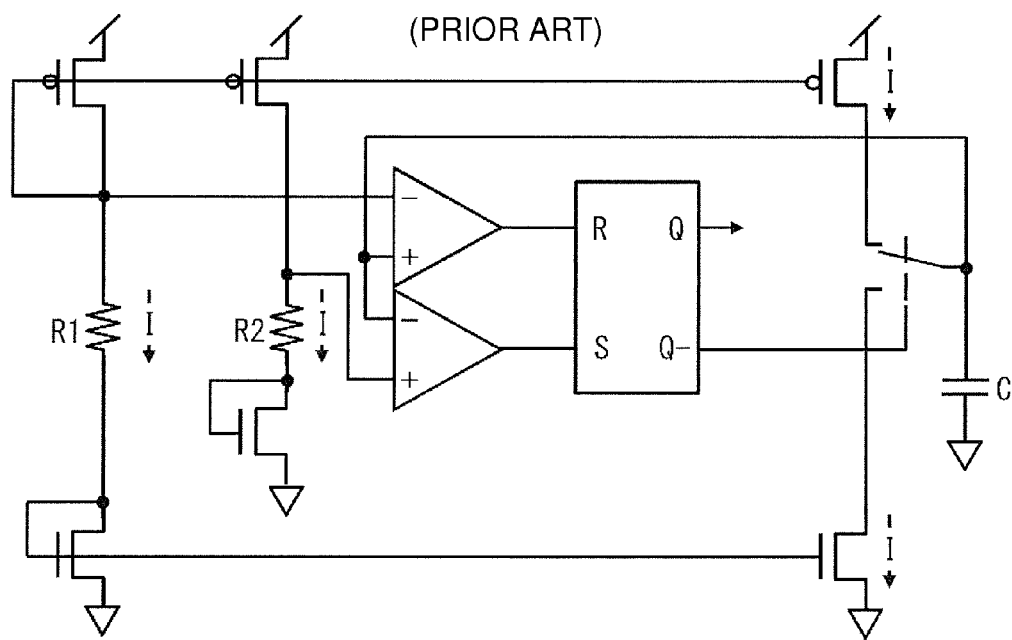
FIG. 25 is a block diagram of an oscillating circuit described in Japanese Unexamined Patent Application Publication (Translation of PCT Application) No. 2006-510309.

In the eighth embodiment, an output driver circuit 70 where a drive current given to the load device is determined by the amount of current of the output current Iout generated by the constant current source circuit 2 will be described. FIG. 24 shows a circuit diagram of the output driver circuit 70. As shown in FIG. 24, the output driver circuit 70 has an inverter 71 and NMOS transistors N70 to N73. Then, the output driver circuit 70 drives a load device 72 coupled between an output terminal Tout and the power supply terminal with the drive current.

In the NMOS transistor N70, the output current Iout that the constant current source circuit 2 outputs is inputted into its drain. A source of the NMOS transistor N70 is coupled to a drain of the NMOS transistor N71. An enable signal EN is inputted into a gate of the NMOS transistor N70.

The drain of the NMOS transistor N71 is coupled with a gate of the NMOS transistor N71. A source of the NMOS transistor N71 is coupled to the ground terminal. The NMOS transistor N72 forms the current mirror circuit together with the NMOS transistor N71. A drain of the NMOS transistor N72 is coupled to the output terminal Tout.

An inversion signal of the enable signal EN is inputted into a gate of the NMOS transistor N73 through the inverter 71. A source of the NMOS transistor N73 is coupled to the ground terminal. A drain of the NMOS transistor N73 is coupled to the gates of the NMOS transistor N71 and the NMOS transistor N72.

Next, an operation of the output driver circuit 70 will be explained. In the output driver circuit 70, when the enable signal EN is in the enabled state (e.g., in the high level), the NMOS transistor N70 turns on and the NMOS transistor N73 turns off. Thereby, the output current Iout flows in the NMOS transistor N71 as a current I10. Then, the current mirror circuit comprised of the NMOS transistors N71, N72 generates a current I11 based on the current I10. This current I11 serves as the drive current given to the load device 72.

On the other hand, in the output driver circuit 70, when the enable signal EN is in a disabled state (e.g., in the low level), the NMOS transistor N70 turns off and the NMOS transistor N73 turns on. Thereby, the output current Iout is intercepted by the NMOS transistor N70. Moreover, since the NMOS transistor N73 is on, gates of the NMOS transistors N71, N72 become the ground voltage, and the current mirror circuit comprised of the NMOS transistors N71, N72 becomes shutdown. That is, the current I11 does not flow.

From the above-mentioned explanation, the output driver circuit 70 determines the drive current for driving the load device 72 based on the output current Iout that the constant current source circuit 2 outputs. Therefore, if the coefficient of variation to the temperature variation of the output current Iout is small, the output driver circuit 70 can make the variation of the drive current small regardless of the temperature variation. Moreover, the output driver circuit 70 can keep an amplitude of the voltage that arises across both ends of the load device 72 constant regardless of the temperature variation. Furthermore, the amplitude of the voltage that arises across the both ends of the load device 72 can be set up with high precision by the constant current source circuit 2 setting and outputting the current value of the output current Iout with high precision.

In addition, the present invention is not limited to the above-mentioned embodiments and can be suitably modified within a range that does not deviate from a gist of the present invention.

What is claimed is:

1. A temperature-compensated semiconductor resistor device, comprising:
    a primary resistor having a resistance value which varies in response to a variation of a substrate temperature;
    a resistance corrector that is coupled in series with the primary resistor and having a corrected resistance value which is switched by a preset resistance step width so that a variation of the resistance value of the primary resistor in response to a variation of the substrate temperature may be suppressed;
    a first voltage generator generating a first voltage that varies in response to the substrate temperature;
    a second voltage generator generating a plurality of second voltages, each of the second voltages specifying a voltage level at which the first voltage causes a switching operation of the corrected resistance value of the resistance corrector to be performed; and
    a resistance switch unit switching the corrected resistance value of the resistance corrector in response to comparing the first voltage and each of the second voltages, wherein:
    the primary resistor and resistance corrector together provide a temperature-compensated resistance.

2. The semiconductor resistor device according to claim 1, wherein the preset resistance step width by which the corrected resistance value is switched has a constant magnitude, and
    wherein the plurality of second voltages have voltage values which vary by a variation width that is expressed by a second-order coefficient.

3. The semiconductor resistor device according to claim 1, wherein the second voltage generator has a negative feedback amplifier to whose first input terminal a reference voltage is inputted, whose second input terminal and output terminal are feedback-coupled, and whose amplification rate is determined by a ratio of a first resistance and a second resistance that are coupled in series; and
    wherein the second voltages are voltages generated at a plurality of nodes that are coupled to a plurality of temperature step setting resistances, a first number of the plurality of temperature step setting resistances forming the first resistance and a second number of the plurality of temperature step setting resistances forming the second resistance.

4. The semiconductor resistor device according to claim 1, wherein the first voltage generator outputs a forward voltage generated across both ends of a diode as the first voltage.

5. The semiconductor device resistor according to claim 1, wherein the resistance corrector includes a plurality of variation step setting resistances each of which has a resistance value of the resistance step width, and
    wherein the resistance switch unit includes:
    a plurality of comparators each of which compares the first voltage with one of the second voltages; and
    a switch circuit that switches at least one of the variation step setting resistances based on outputs of the comparators.

6. A microprocessor, comprising:
    the semiconductor resistor device according to claim 1;
    memory for storing a program and a preset value;
    a calculation core for performing a data processing based on the program stored in the memory; and
    a current generating circuit configured to output an output current whose magnitude is determined by the temperature-compensated resistance.

7. The microprocessor according to claim 6,
    wherein the current generating circuit includes:
    a buffer circuit having an input node and a first output node, the buffer circuit configured to have a reference voltage inputted to the input node and configured to output to the first output node, the same voltage as the reference voltage inputted into its input node; and
    a power supply transistor that is current-mirror-coupled with an output transistor of the buffer circuit and outputs the output current from a first terminal thereof, and
    wherein the temperature-compensated resistance is coupled to the first output node of the buffer circuit.

8. The microprocessor according to claim 6,
    wherein the current generating circuit includes:
    a first transistor having a control terminal and a first terminal coupled to one another; and
    a second transistor having a control terminal that is common coupled with the control terminal of the first transistor and a first terminal that outputs the output current;
    wherein the temperature-compensated resistance is coupled between the first terminal of the first transistor and a first power supply terminal.

9. The microprocessor according to claim 6, further comprising:
    an oscillating circuit whose oscillating frequency of its output signal is determined based on the output current.

10. The microprocessor according to claim 6, further comprising:
    a delay circuit whose delay time is set based on the output current.

11. The microprocessor according to claim 6, further comprising:
    an output driver circuit configured to determine a current value of a load driving current based on the output current.

12. The microprocessor according to claim 11, wherein:
the output driver circuit comprises first and second transistors which are current-mirror-coupled, gates of the first and second transistors being coupled to one another;
the first transistor is configured to conduct the output current, when the output driver circuit is enabled; and
the second transistor is configured to conduct the load driving current, when the output driver circuit is enabled.

13. A constant current source circuit comprising:
a semiconductor resistor device in accordance with claim 1; and
a current generating circuit comprising:
an input node and first and second output nodes;
a first transistor having a control terminal and a first terminal, the first terminal being coupled to the first output node;
a second transistor having a control terminal and a first terminal, the first terminal being coupled to the second output node and configured to output an output current; and
an error amplifier having first and second inputs and an output, the first input of the error amplifier being coupled to the input node, the second input of the error amplifier being coupled to the first terminal of the first transistor, and the output of the error amplifier being coupled to the control terminals of both the first and second transistors; and
wherein the temperature-compensated resistance of the semiconductor resistor device is coupled to the first output node.

14. The constant current source circuit according to claim 13, wherein
the output current from the second transistor is proportional to a current supplied by the first transistor through the temperature-compensated resistance; and
a reference voltage applied to the input node also appears at the first output node.

15. An oscillator comprising the constant current source circuit of claim 13, wherein:
an oscillating frequency of the oscillating circuit is suppressed within a fixed range which is in proportion to the preset resistance step width.

16. A current generating circuit comprising:
a semiconductor resistor device in accordance with claim 1;
a first transistor having a control terminal and a first terminal coupled to one another;
a second transistor having a control terminal that is common coupled with the control terminal of the first transistor, and a first terminal configured to outputs an output current; and
wherein the temperature-compensated resistance of the semiconductor resistor device is coupled between the first terminal of the first transistor output node and a first power supply terminal.

17. An oscillator comprising the current generating circuit of claim 16, wherein:
an oscillating frequency of the oscillating circuit is suppressed within a fixed range which is in proportion to the preset resistance step width.

18. A temperature-compensated semiconductor resistor device, comprising:
a primary resistor having a resistance value which varies in response to a variation of a substrate temperature;
a resistance corrector coupled in series with the primary resistor and configured to provide a corrected resistance value, the resistance corrector comprising a plurality of discrete resistances, each of said plurality of discrete resistances configured to be bypassed to control the corrected resistance value;
a resistance switch unit comprising a plurality of comparators whose outputs control a corresponding plurality of switches, each switch configured to selectively bypass a corresponding one of the discrete resistances to thereby control the corrected resistance value;
a first voltage generator for generating a first voltage that varies in response to the substrate temperature, the first voltage forming a first input to each of the comparators;
a voltage divider configured to generate a plurality of second voltages, each of the second voltages forming a second input to a corresponding one of the comparators; wherein:
in response to a comparison of the first voltage with the corresponding second voltage input thereto, each comparator controls the corresponding switch to thereby selectively bypass a corresponding one of the discrete resistances and control the corrected resistance value of the resistance corrector; and
the primary resistor and resistance corrector together provide a temperature-compensated resistance.

19. The semiconductor resistor device according to claim 18, wherein
the plurality of discrete resistances are arranged in series; and
the plurality of discrete resistances all have the same value.

20. The semiconductor resistor device according to claim 18, wherein
the plurality of second voltages generated by the voltage divider are unevenly spaced such that there is a non-linear relationship between the first voltage and the corrected resistance value.

* * * * *